US010170826B2

(12) United States Patent
Nakazawa et al.

(10) Patent No.: US 10,170,826 B2
(45) Date of Patent: Jan. 1, 2019

(54) TFT SUBSTRATE, SCANNING ANTENNA USING SAME, AND METHOD FOR MANUFACTURING TFT SUBSTRATE

(71) Applicant: Sharp Kabushiki Kaisha, Sakai, Osaka (JP)

(72) Inventors: Makoto Nakazawa, Sakai (JP); Takatoshi Orui, Sakai (JP); Shigeyasu Mori, Sakai (JP); Fumiki Nakano, Sakai (JP); Kiyoshi Minoura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 16 days.

(21) Appl. No.: 15/542,488

(22) PCT Filed: Oct. 6, 2016

(86) PCT No.: PCT/JP2016/079735
§ 371 (c)(1),
(2) Date: Jul. 10, 2017

(87) PCT Pub. No.: WO2017/061527
PCT Pub. Date: Apr. 13, 2017

(65) Prior Publication Data
US 2018/0337446 A1 Nov. 22, 2018

(30) Foreign Application Priority Data
Oct. 9, 2015 (JP) .................................. 2015-201172

(51) Int. Cl.
H01Q 1/00 (2006.01)
H01Q 1/38 (2006.01)
(Continued)

(52) U.S. Cl.
CPC .............. *H01Q 1/38* (2013.01); *H01L 23/345* (2013.01); *H01L 23/66* (2013.01); *H01L 27/124* (2013.01);
(Continued)

(58) Field of Classification Search
CPC .......... H01Q 1/38; H01Q 1/00; H01L 23/345; H01L 23/66; H01L 27/1222
(Continued)

(56) References Cited

U.S. PATENT DOCUMENTS 7,466,269 B2   12/2008   Haziza
7,847,894 B2   12/2010   Rho
(Continued)

FOREIGN PATENT DOCUMENTS

EP   0 472 403 A2   2/1992
JP   04-234202 A    8/1992
(Continued)

OTHER PUBLICATIONS

Nakazawa et al., "Scanning Antenna", U.S. Appl. No. 15/553,373, filed Aug. 24, 2017.
(Continued)

Primary Examiner — Huedung Mancuso
(74) Attorney, Agent, or Firm — Keating & Bennett, LLP

(57) ABSTRACT

A TFT substrate (101) including a plurality of antenna element regions (U) arranged on a dielectric substrate (1), the TFT substrate including a transmitting/receiving region including a plurality of antenna element regions, and a non-transmitting/receiving region located outside of the transmitting/receiving region, each of the plurality of antenna element regions (U) including: a thin film transistor (10); a first insulating layer (11) covering the thin film transistor and having a first opening (CH1) which exposes a drain electrode (7D) of the thin film transistor (10); and a
(Continued)

patch electrode (15) formed on the first insulating layer (11) and in the first opening (CH1), and electrically connected to the drain electrode (7D) of the thin film transistor, wherein the patch electrode (15) includes a metal layer, and a thickness of the metal layer is greater than a thickness of a source electrode (7S) and the drain electrode (7D) of the thin film transistor.

16 Claims, 19 Drawing Sheets

(51) Int. Cl.

| | |
|---|---|
| H01Q 21/00 | (2006.01) |
| H01Q 1/24 | (2006.01) |
| H01L 23/34 | (2006.01) |
| H01L 23/66 | (2006.01) |
| H01L 27/12 | (2006.01) |
| H01L 29/786 | (2006.01) |
| H01Q 21/06 | (2006.01) |
| G09G 3/36 | (2006.01) |

(52) U.S. Cl.
CPC ...... *H01L 27/1222* (2013.01); *H01L 27/1225* (2013.01); *H01L 27/1255* (2013.01); *H01L 27/1259* (2013.01); *H01L 29/7869* (2013.01); *H01L 29/78669* (2013.01); *H01Q 1/241* (2013.01); *H01Q 21/0087* (2013.01); *H01Q 21/064* (2013.01); *G09G 3/3614* (2013.01); *G09G 3/3648* (2013.01); *H01L 2223/6677* (2013.01)

(58) Field of Classification Search
USPC .......................................................... 343/720
See application file for complete search history.

(56) References Cited

U.S. PATENT DOCUMENTS

| | | | | |
|---|---|---|---|---|
| 8,537,313 | B2* | 9/2013 | Liou | ................ G02F 1/133514 |
| | | | | 349/106 |
| 8,786,516 | B2* | 7/2014 | Parsche | ................ H01Q 1/243 |
| | | | | 343/700 MS |
| 9,448,433 | B2* | 9/2016 | Yamazaki | ........ G02F 1/133555 |
| 2012/0138922 | A1 | 6/2012 | Yamazaki et al. | |
| 2012/0194399 | A1 | 8/2012 | Bily et al. | |
| 2013/0320334 | A1 | 12/2013 | Yamazaki et al. | |
| 2014/0286076 | A1 | 9/2014 | Aoki et al. | |

FOREIGN PATENT DOCUMENTS

| | | |
|---|---|---|
| JP | 2000-022428 A | 1/2000 |
| JP | 2002-217640 A | 8/2002 |
| JP | 2007-116573 A | 5/2007 |
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |

OTHER PUBLICATIONS

Orui et al., "Scanning Antenna and Method for Manufacturing Same", U.S. Appl. No. 15/553,376, filed Aug. 24, 2017.
Stevenson et al., "Rethinking Wireless Communications: Advanced Antenna Design using LCD Technology", SID 2015 Digest, 55.2, 2015, pp. 827-830.
Ando et al., "A Radial Line Slot Antenna for 12 GHz Satellite TV Reception", IEEE Transactions on Antennas and Propagation, vol. AP-33, No. 12, Dec. 1985, pp. 1347-1353.
Wittek et al., "Liquid Crystals for Smart Antennas and Other Microwave Applications", SID 2015 Digest, 55.1, 2015, pp. 824-826.
Kuki, "Novel RF Functional Devices Using Liquid Crystal", Polymer, vol. 55, Aug. 2006, pp. 599-602.

* cited by examiner (a)

(b)

(a)

(b)

(c)

(a)

(b)

(a)

(b)

(a)

(b)

(c)

(a)

(b)

TFT SUBSTRATE, SCANNING ANTENNA USING SAME, AND METHOD FOR MANUFACTURING TFT SUBSTRATE

TECHNICAL FIELD

The present invention relates to a scanned antenna, and particularly to a scanned antenna (which may be referred to as a "liquid crystal array antenna") in which each antenna element (which may be referred to as an "element antenna") includes a liquid crystal capacitor, and a method for manufacturing the same.

BACKGROUND ART

Antennas for mobile communication and satellite broadcasting applications need to have the capability of changing the beam direction (referred to as "beam scanning" or "beam steering"). As antennas having such a capability (hereinafter referred to as "scanned antennas"), phased array antennas including antenna elements have been known in the art. However, the high cost of conventional phased array antennas has been an obstacle for their widespread application to consumer products. Particularly, the cost increases significantly when the number of antenna elements increases.

In view of this, scanned antennas have been proposed in the art that utilize the high dielectric anisotropy (birefringence) of liquid crystal materials (including nematic liquid crystals and polymer-dispersed liquid crystals) (Patent Document Nos. 1 to 4 and Non-Patent Document No. 1). The dielectric constant of a liquid crystal material has a frequency dispersion, and the dielectric constant in the microwave frequency band (which may be referred to as the "dielectric constant for microwaves") will be particularly designated as "dielectric constant $M(\varepsilon_M)$" in the present specification.

Patent Document No. 3 and Non-Patent Document No. 1 state that an inexpensive scanned antenna can be realized by using technology for liquid crystal display devices (hereinafter referred to as "LCDs").

CITATION LIST

Patent Literature

[Patent Document No. 1] Japanese Laid-Open Patent Publication No. 2007-116573
[Patent Document No. 2] Japanese Laid-Open Patent Publication No. 2007-295044
[Patent Document No. 3] Japanese National Phase PCT Laid-Open Publication No. 2009-538565
[Patent Document No. 4] Japanese National Phase PCT Laid-Open Publication No. 2013-539949

Non-Patent Literature

[Non-Patent Document No. 1] R. A. Stevenson et al., "Rethinking Wireless Communications: Advanced Antenna Design using LCD Technology", SID 2015 DIGEST, pp. 827-830.
[Non-Patent Document No. 2] M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY OF INVENTION

Technical Problem

The idea of realizing an inexpensive scanned antenna through the application of LCD technology as described above has been known in the art, but there is no literature specifically describing the structure of a scanned antenna using LCD technology, the method for manufacturing the same, and the method for driving the same.

In view of this, it is an object of the present invention to provide a TFT substrate for a scanned antenna capable of being mass-produced by using conventional LCD manufacturing technology, a scanned antenna using the same, and a method for manufacturing such a TFT substrate.

Solution to Problem

A TFT substrate according to one embodiment of the present invention is a TFT substrate including a dielectric substrate and a plurality of antenna element regions arranged on the dielectric substrate, the TFT substrate including a transmitting/receiving region including the plurality of antenna element regions therein, and a non-transmitting/receiving region located outside of the transmitting/receiving region, each of the plurality of antenna element regions including: a thin film transistor supported on the dielectric substrate, the thin film transistor including a gate electrode, a semiconductor layer, a gate insulating layer located between the gate electrode and the semiconductor layer, and a source electrode and a drain electrode electrically connected to the semiconductor layer; a first insulating layer covering the thin film transistor and having a first opening which exposes the drain electrode of the thin film transistor; and a patch electrode formed on the first insulating layer and in the first opening, and electrically connected to the drain electrode of the thin film transistor, wherein the patch electrode includes a metal layer, and a thickness of the metal layer is greater than a thickness of the source electrode and the drain electrode of the thin film transistor.

In one embodiment, the TFT substrate may further include a second insulating layer covering the patch electrode. The thickness of the metal layer may be 1 µm or more and 30 µm or less.

In one embodiment, the TFT substrate may further include, in the transmitting/receiving region, a resistive film formed on the dielectric substrate and a heater terminal connected to the resistive film.

In one embodiment, the TFT substrate further includes a transfer terminal portion arranged in the non-transmitting/receiving region, the transfer terminal portion including: a patch connecting portion formed of the same conductive film as the patch electrode; the second insulating layer extending over the patch connecting portion and having a second opening which exposes a portion of the patch connecting portion; and an upper transparent electrode formed on the second insulating layer and in the second opening, and electrically connected to the patch connecting portion.

In one embodiment, the TFT substrate further includes a gate terminal portion, the gate terminal portion including: a gate bus line formed of the same conductive film as the gate electrode; the gate insulating layer, the first insulating layer and the second insulating layer which extend over the gate bus line; and a gate terminal upper connecting portion formed form the same transparent conductive film as the upper transparent electrode, wherein: a gate terminal contact hole exposing a portion of the gate bus line is formed in the gate insulating layer, the first insulating layer and the second insulating layer; and the gate terminal upper connecting portion is arranged on the second insulating layer and in the gate terminal contact hole, and is in contact with the gate bus line in the gate terminal contact hole.

In one embodiment, the TFT substrate further includes a transfer terminal portion arranged in the non-transmitting/receiving region, the transfer terminal portion including: a source connection line formed of the same conductive film as the source electrode; the first insulating layer extending over the source connection line, and having a third opening which exposes a portion of the source connection line and a fourth opening which exposes another portion of the source connection line; a patch connecting portion formed on the first insulating layer and in the third opening; and an upper transparent electrode formed on the first insulating layer and in the fourth opening, wherein: the patch connecting portion is electrically connected to the upper transparent electrode via the source connection line; the patch connecting portion is formed of the same conductive film as the patch electrode; and the second insulating layer extends over the transfer terminal portion, covers the patch connecting portion, and has an opening which exposes at least a portion of the upper transparent electrode.

In one embodiment, the TFT substrate further includes a transfer terminal portion arranged in the non-transmitting/receiving region, the transfer terminal portion including: a patch connecting portion on the first insulating layer, the patch connecting portion being formed of the same conductive film as the patch electrode; and a protection conductive layer covering the patch connecting portion, wherein the second insulating layer extends over the protection conductive layer, and has an opening which exposes a portion of the protection conductive layer.

In one embodiment, the TFT substrate further includes a gate terminal portion, the gate terminal portion including: a gate bus line formed of the same conductive film as the gate electrode; the gate insulating layer and the first insulating layer which extend over the gate bus line; and a gate terminal upper connecting portion formed of a transparent conductive film, wherein: a gate terminal contact hole exposing the gate terminal upper connecting portion is formed in the gate insulating layer and the first insulating layer; the gate terminal upper connecting portion is arranged on the first insulating layer and in the gate terminal contact hole, and is in contact with the gate bus line in the gate terminal contact hole; and the second insulating layer extends over the gate terminal upper connecting portion, and has an opening which exposes a portion of the gate terminal upper connecting portion.

A scanned antenna according to one embodiment of the present invention includes: one of the TFT substrates set forth above; a slot substrate arranged so as to oppose the TFT substrate; a liquid crystal layer provided between the TFT substrate and the slot substrate; and a reflective conductive plate arranged so as to oppose a surface of the slot substrate that is opposite from the liquid crystal layer with a dielectric layer interposed therebetween; the slot substrate includes another dielectric substrate and a slot electrode formed on a surface of the other dielectric substrate that is closer to the liquid crystal layer; and the slot electrode includes a plurality of slots arranged so as to correspond to the patch electrode in the plurality of antenna element regions of the TFT substrate.

A scanned antenna according to another embodiment of the present invention includes: one of the TFT substrates set forth above; a slot substrate arranged so as to oppose the TFT substrate; a liquid crystal layer provided between the TFT substrate and the slot substrate; and a reflective conductive plate arranged so as to oppose a surface of the slot substrate that is opposite from the liquid crystal layer with a dielectric layer interposed therebetween, wherein: the slot substrate includes another dielectric substrate and a slot electrode formed on a surface of the other dielectric substrate that is closer to the liquid crystal layer; the slot electrode includes a plurality of slots arranged so as to correspond to the patch electrode in the plurality of antenna element regions of the TFT substrate; and the slot electrode is connected to the transfer terminal portion of the TFT substrate.

A method for manufacturing a TFT substrate according to one embodiment of the present invention, the TFT substrate including a transmitting/receiving region including a plurality of antenna element regions therein, and a non-transmitting/receiving region other than the transmitting/receiving region, the plurality of antenna element regions each including a thin film transistor and a patch electrode, the method including the steps of: (a) forming a thin film transistor on a dielectric substrate; (b) forming a first insulating layer covering the thin film transistor, and forming in the first insulating layer a first opening which exposes a portion of a drain electrode of the thin film transistor; (c) forming a patch electrode conductive film on the first insulating layer and in the first opening, and patterning the patch electrode conductive film so as to form a patch electrode in contact with the drain electrode in the first opening; and (d) forming a second insulating layer covering the patch electrode, wherein the patch electrode includes a metal layer, and a thickness of the metal layer is greater than a thickness of a source electrode and the drain electrode of the thin film transistor.

In one embodiment, the step (a) includes the steps of: (a1) forming a gate conductive film on a dielectric substrate, and patterning the gate conductive film so as to form a plurality of gate bus lines and a gate electrode of the thin film transistor; (a2) forming a gate insulating layer covering the plurality of gate bus lines and the gate electrodes; (a3) forming a semiconductor layer of the thin film transistor on the gate insulating layer; and (a4) forming a source conductive film on the semiconductor layer and on the gate insulating layer, and patterning the source conductive film so as to form a plurality of source bus lines, and a source electrode and a drain electrode connected to the semiconductor layer, thus obtaining the thin film transistor.

In one embodiment, the TFT substrate further includes a gate terminal portion and a transfer terminal portion in the non-transmitting/receiving region; the step (c) includes a step of patterning the patch electrode conductive film so as to form a patch connecting portion in the non-transmitting/receiving region; and after the step (d), the method includes the steps of: etching the gate insulating layer, the first insulating layer and the second insulating layer at once, thereby forming a second opening which exposes the patch connecting portion in the second insulating layer, and forming a gate terminal contact hole which exposes a portion of the gate bus line in the gate insulating layer, the first insulating layer and the second insulating layer; and forming a transparent conductive film on the second insulating layer, in the second opening and in the gate terminal contact hole, and patterning the transparent conductive film so as to form an upper transparent electrode in contact with the patch connecting portion in the second opening, thus obtaining the transfer terminal portion and to form a gate terminal upper connecting portion in contact with the gate bus line in the gate terminal contact hole, thus obtaining the gate terminal portion.

In one embodiment, the TFT substrate further includes a gate terminal portion and a transfer terminal portion in the non-transmitting/receiving region; the step (a4) includes a step of patterning the source conductive film so as to form a source connection line in the non-transmitting/receiving region; the step (b) of forming the first opening in the first insulating layer and forming a third opening which exposes a portion of the source connection line, a fourth opening which exposes a portion of the source connection line, and a gate terminal contact hole which exposes a portion of the gate bus line; the method further includes, between the step (b) and the step (c), a step of forming a transparent conductive film and patterning the transparent conductive film so as to form an upper transparent electrode in contact with the source connection line in the third opening and form a gate terminal upper connecting portion in contact with the gate bus line in the gate terminal contact hole, thus obtaining the gate terminal portion; the step (c) further includes a step of patterning the patch electrode conductive film so as to form a patch connecting portion in contact with the source connection line in the fourth opening, thus obtaining the transfer terminal portion, wherein in the transfer terminal portion, the patch connecting portion and the upper transparent electrode are electrically connected to each other via the source connection line; and the method further includes, after the step (d), a step of forming, in the second insulating layer, an opening which exposes a portion of the upper transparent electrode, and an opening which exposes a portion of the gate terminal upper connecting portion.

In one embodiment, the TFT substrate further includes a gate terminal portion and a transfer terminal portion in the non-transmitting/receiving region; the step (b) includes a step of forming the first opening in the first insulating layer and forming gate terminal contact hole exposing a portion of the gate bus line; the method further includes, between the step (b) and the step (c), a step of forming a transparent conductive film and patterning the transparent conductive film so as to form a gate terminal upper connecting portion in contact with the gate bus line in the gate terminal contact hole, thus obtaining the gate terminal portion; the step (c) includes a step of patterning the patch electrode conductive film so as to form a patch connecting portion in the non-transmitting/receiving region; the method further includes, between the step (c) and the step (d), a step of forming a protection conductive layer covering the patch connecting portion; and after the step (d), the method includes a step of forming, in the second insulating layer, an opening which exposes a portion of the protection conductive layer, and an opening which exposes a portion of the gate terminal upper connecting portion.

Advantageous Effects of Invention

An embodiment of the present invention provides a TFT substrate for a scanned antenna that can be mass-produced using the conventional LCD manufacturing technology, a scanned antenna using the same, and a method for manufacturing the TFT substrate.

BRIEF DESCRIPTION OF DRAWINGS

FIG. 20(a) is a schematic diagram showing the structure of a conventional LCD 900, and (b) is a schematic cross-sectional view of an LCD panel 900a.

DESCRIPTION OF EMBODIMENTS

A scanned antenna and a method for manufacturing the same according to an embodiment of the present invention will now be described with reference to the drawings. In the following description, first, the structure of a known TFTtype LCD (hereinafter referred to as a "TFT-LCD") and a method for manufacturing the same will be described. Note however that things that are well known in the technical field of LCDs may not be discussed below. For the basic technology of TFT-LCDs, refer to Liquid Crystals, Applications and Uses, Vol. 1-3 (Editor: Birenda Bahadur, Publisher: World Scientific Pub Co Inc), for example. The entire disclosure of the document above is herein incorporated by reference.

Figure 20:
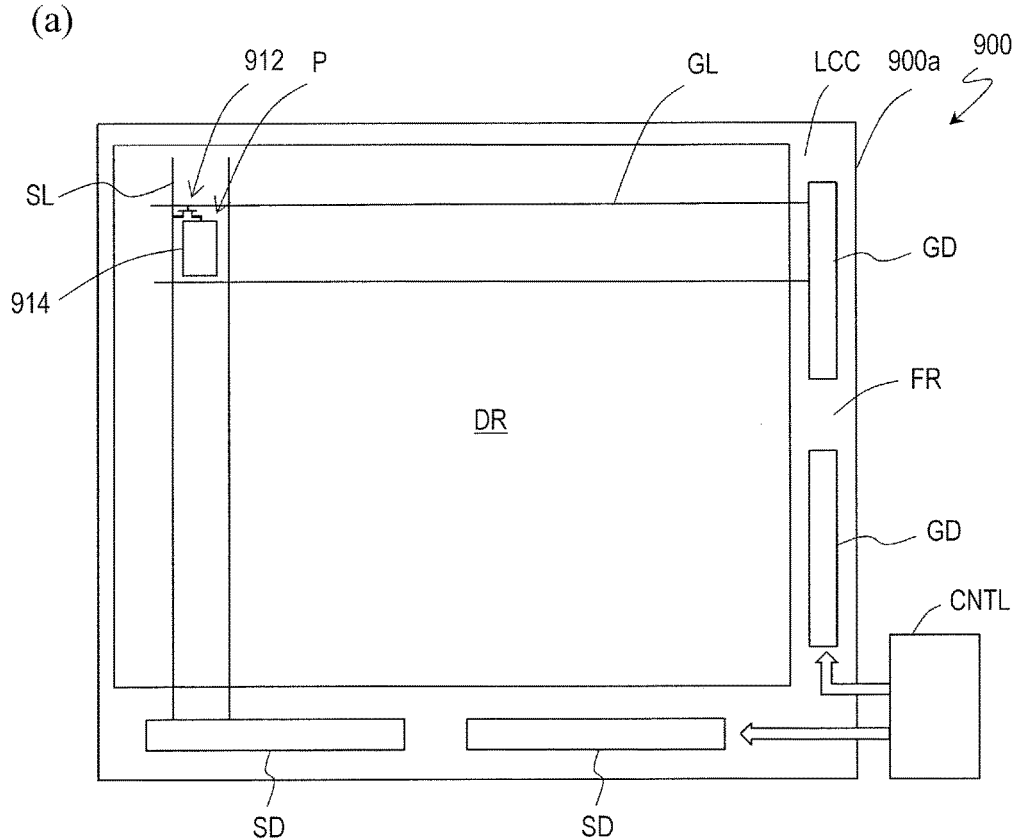
Figure 20:
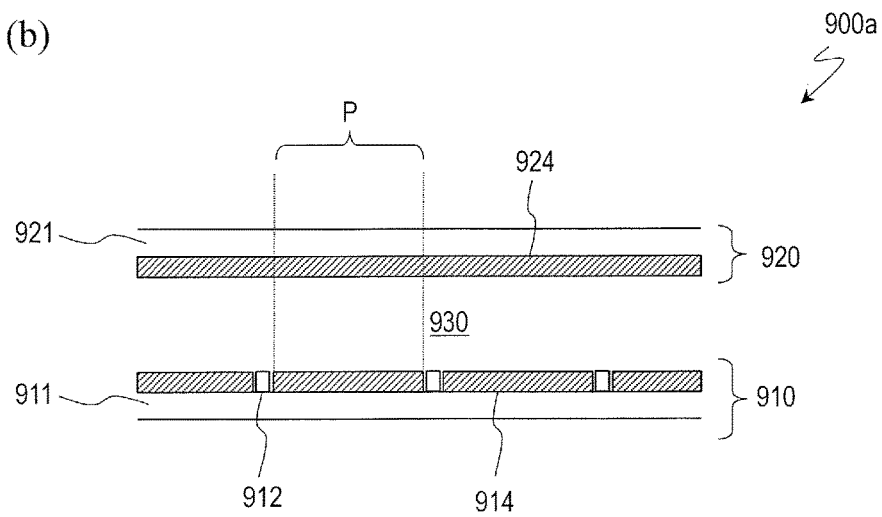

Referring to FIGS. 20(a) and 20(b), the structure and the operation of a typical transmissive-type TFT-LCD (hereinafter referred to simply as an "LCD") 900 will be described. Herein, the LCD 900 of a vertical electric field mode (e.g., a TN mode or a vertical alignment mode), in which the voltage is applied in the direction of the thickness of the liquid crystal layer, will be illustrated. The frame frequency of the voltage applied to a liquid crystal capacitor of an LCD (typically, twice the polarity inversion frequency) is 240 Hz even with 4× speed driving, for example, and the dielectric constant ε of the liquid crystal layer as the dielectric layer of a liquid crystal capacitor of an LCD is different from the dielectric constant $M(\varepsilon_M)$ for microwave (e.g., satellite broadcasting or the Ku band (12 to 18 GHz), the K band (18 to 26 GHz) and the Ka band (26 to 40 GHz)).

As schematically shown in FIG. 20(a), the transmissive-type LCD 900 includes a liquid crystal display panel 900a, a control circuit CNTL, a backlight (not shown), a power supply circuit (not shown), etc. The liquid crystal display panel 900a includes a liquid crystal display cell LCC, and a driving circuit including a gate driver GD and a source driver SD. For example, the driving circuit may be mounted on a TFT substrate 910 of the liquid crystal display cell LCC, or a part or whole of the driving circuit may be integrated (monolithicized) with the TFT substrate 910.

FIG. 20(b) schematically shows a cross-sectional view of a liquid crystal display panel (herein referred to as an "LCD panel") 900a of the LCD 900. The LCD panel 900a includes the TFT substrate 910, a counter substrate 920, and a liquid crystal layer 930 provided therebetween. The TFT substrate 910 and the counter substrate 920 include transparent substrates 911 and 921, each of which is a glass substrate, or the like. Plastic substrates may be used, as well as glass substrates, as the transparent substrates 911 and 921. A plastic substrate is formed of a transparent resin (e.g., polyester) and a glass fiber (e.g., a non-woven fabric), for example.

A display region DR of the LCD panel 900a includes pixels P arranged in a matrix arrangement. A frame region FR, which does not contribute to display, is formed around the display region DR. The liquid crystal material is sealed in the display region DR by means of a seal portion (not shown) formed so as to surround the display region DR. The seal portion is formed by curing a sealant that includes a UV curable resin and spacers (e.g., resin beads), for example, and the seal portion bonds and secures the TFT substrate 910 and the counter substrate 920 with each other. The spacers in the sealant control the thickness of the gap between the TFT substrate 910 and the counter substrate 920, i.e., the thickness of the liquid crystal layer 930, to be constant. In order to suppress the in-plane variations of the thickness of the liquid crystal layer 930, columnar spacers are formed by using a UV curable resin in the shaded portions of the display region DR (e.g., over lines). In recent years, the thickness of the frame region FR, which does not contribute to display, is very small as in LCD panels for liquid crystal televisions and smart phones.

The TFT substrate 910 includes a TFT 912, a gate bus line (scanning line) GL, a source bus line (display signal line) SL, a pixel electrode 914, a storage capacitor electrode (not shown) and a CS bus line (storage capacitor line) (not shown) formed on the transparent substrate 911. The CS bus line is provided parallel to the gate bus line. Alternatively, the gate bus line of the following tier may be used as the CS bus line (CS-on-gate structure).

The pixel electrode 914 is covered by an alignment film (e.g., a polyimide film) that controls the liquid crystal alignment. The alignment film is provided so as to be in contact with the liquid crystal layer 930. The TFT substrate 910 is often arranged on the backlight side (the opposite side from the observer).

The counter substrate 920 is often arranged on the observer side of the liquid crystal layer 930. The counter substrate 920 includes a color filter layer (not shown), a counter electrode 924 and an alignment film (not shown) on the transparent substrate 921. The counter electrode 924 is provided commonly for the plurality of pixels P of the display region DR, and it is therefore also called a common electrode. The color filter layer includes color filters (e.g., red filters, green filters and blue filters) provided for each pixel P, and a black matrix (light-blocking layer) for blocking light that is unnecessary for display. The black matrix is arranged so as to block light between pixels P in the display region DR and in the frame region FR, for example.

The pixel electrode 914 of the TFT substrate 910, the counter electrode 924 of the counter substrate 920, and the liquid crystal layer 930 therebetween together form a liquid crystal capacitor Clc. Each liquid crystal capacitor corresponds to a pixel. A storage capacitor CS connected electrically parallel to the liquid crystal capacitor Clc is provided in order to retain the voltage applied to the liquid crystal capacitor Clc (in order to increase the so-called voltage retention). The storage capacitor CS is typically composed of an electrode that is controlled to be at the same potential as the pixel electrode 914, an inorganic insulating layer (e.g., a gate insulating layer ($SiO_2$ layer)), and a storage capacitor electrode connected to the CS bus line. The same common voltage as the counter electrode 924 is typically supplied from the CS bus line.

Factors for the lowering of the voltage (effective voltage) applied to the liquid crystal capacitor Clc include, for example, (1) a factor based on the CR time constant, which is the product between the capacitance value $C_{Clc}$ and the resistance value R, and (2) interfacial polarization and/or alignment polarization of liquid crystal molecules due to ionic impurities included in the liquid crystal material. Among these factors, the CR time constant of the liquid crystal capacitor Clc has a significant contribution, and it is possible to increase the CR time constant by providing the storage capacitor CS connected electrically parallel to the liquid crystal capacitor Clc. Note that the volume resistivity of the liquid crystal layer 930, which is the dielectric layer of the liquid crystal capacitor Clc, is over the order of $10^{12}$ Ω·cm for a commonly-used nematic liquid crystal material.

When a TFT 912 is selected and turned ON by the scanning signal supplied from the gate driver GD to the gate bus line GL, the display signal supplied to the pixel electrode 914 is a display signal that is supplied to the source bus line SL connected to the TFT 912. Therefore, TFTs 912 connected to a gate bus line GL are turned ON simultaneously, at which point in time, a corresponding display signal is supplied from the source bus line SL connected to the TFTs 912 of the pixels P of that row. By performing this operation successively from the first row (e.g., the uppermost row of the display surface) to the $m^{th}$ row (e.g., the lowermost row of the display surface), one image (frame) is written and displayed in the display region DR, which is composed of m pixel rows. Where the pixels P are arranged in a matrix arrangement of m rows and n columns, at least one source bus line SL is provided corresponding to each pixel column, i.e., a total of at least n source bus lines SL are provided.

Such scanning is called line-sequential scanning, wherein the amount of time after one pixel row is selected until the next row is selected is called a horizontal scanning period (1H), and the amount of time after one row is selected until the same row is selected again is called a vertical scanning period (1V) or a frame. Note that 1V (or one frame) is typically equal to the period m·H, over which all of the m pixel rows are selected, plus the blanking period.

For example, when the input video signal is an NTSC signal, 1V (=one frame) of a conventional LCD panel was 1/60 sec (16.7 msec). While an NTSC signal is an interlaced signal, the frame frequency is 30 Hz and the field frequency is 60 Hz, it is necessary, with an LCD panel, to supply the display signal to all the pixels in each field, and the LCD panel is driven with 1V=(1/60) sec (60 Hz driving). Note that in recent years, there are LCD panels that are driven by 2× speed driving (120 Hz driving, 1V=(1/120) sec) in order to improve the video display characteristics, and those that are driven by 4× speed driving (240 Hz driving, 1V=(1/240) sec) for 3D display.

When a direct current voltage is applied to the liquid crystal layer 930, the effective voltage lowers, thereby lowering the brightness of pixels P. Since the interfacial polarization and/or alignment polarization described above contribute to this lowering of the effective voltage, it is difficult to completely prevent even if the storage capacitor CS is provided. For example, if a display signal corresponding to a certain intermediate gray level is written to all the pixels in each frame, the brightness varies frame to frame, which is observed as flicker. When a direct current voltage is applied to the liquid crystal layer 930 over a long time, electrolysis of the liquid crystal material may occur. Moreover, impurity ion may segregate on one electrode, thus failing to apply an effective voltage to the liquid crystal layer and failing to move the liquid crystal molecules. In order to prevent these problems, the LCD panel 900a is driven by a so-called AC driving. Typically, frame inversion driving is performed, in which the polarity of the display signal is inverted every frame (for each vertical scanning period). For example, with a conventional LCD panel, the polarity is inverted every 1/60 sec (the cycle of polarity inversion is 30 Hz).

In order to uniformly distribute, even within one frame, pixels that are different in terms of the polarity of the voltage applied thereto, dot inversion driving, line inversion driving, and the like, have been employed. This is because it is difficult to completely match the level of the effective voltage to be applied to the liquid crystal layer between the positive polarity and the negative polarity. For example, when the volume resistivity of the liquid crystal material is over the order of $10^{12}$ Ω·cm, flicker is hardly observed if dot inversion or line inversion driving is performed every 1/60 sec.

In the LCD panel 900a, the scanning signal and the display signal are supplied from the gate driver GD and the source driver SD to the gate bus line GL and the source bus line SL, respectively, based on signals supplied from the control circuit CNTL to the gate driver GD and the source driver SD. For example, the gate driver GD and the source driver SD are connected respectively to corresponding terminals provided on the TFT substrate 910. The gate driver GD and the source driver SD may be mounted as driver ICs in the frame region FR of the TFT substrate 910, or may be monolithically formed in the frame region FR of the TFT substrate 910, for example.

The counter electrode 924 of the counter substrate 920 is electrically connected to a terminal (not shown) of the TFT substrate 910 via a conductive portion (not shown) that is called a transfer. A transfer is formed so as to be laid over the seal portion, or is formed by giving electrical conductivity to a portion of the seal portion, for example. This is to realize a narrow frame region FR. The common voltage is supplied directly or indirectly to the counter electrode 924 from the control circuit CNTL. Typically, the common voltage is supplied also to the CS bus line as described above.

[Basic Structure of Scanned Antenna]

With a scanned antenna using antenna elements that utilize the significant dielectric constant $M(\varepsilon_M)$ anisotropy (birefringence) of the liquid crystal material, the voltage to be applied to the liquid crystal layer from each of the antenna elements associated with the pixels of the LCD panel is controlled so as to vary the effective dielectric constant $M(\varepsilon_M)$ of the liquid crystal layer of the various antenna elements, thereby forming a two-dimensional pattern with antenna elements of different static capacitances (corresponding to displaying an image on an LCD). The electromagnetic wave (e.g., microwave) emitted from, or received by, an antenna is given a phase difference depending on the static capacitance of the antenna element, thus realizing a strong directionality toward a particular direction depending on the two-dimensional pattern formed by antenna elements of different static capacitances (beam scanning). For example, the electromagnetic wave emitted from the antenna can be obtained by integrating together spherical waves that are obtained as the input electromagnetic wave is incident upon antenna elements to be scattered by the antenna elements, taking into consideration the phase differences given by the antenna elements. It may be considered that each antenna element is functioning as a "phase shifter". For the basic structure and the operation principle of a scanned antenna using a liquid crystal material, refer to Patent Document Nos. 1 to 4 and Non-Patent Document Nos. 1 and 2. Non-Patent Document No. 2 discloses a basic structure of a scanned antenna having a spiral slot arrangement. The entire disclosures of Patent Document Nos. 1 to 4 and Non-Patent Document Nos. 1 and 2 are herein incorporated by reference.

Figure 1:
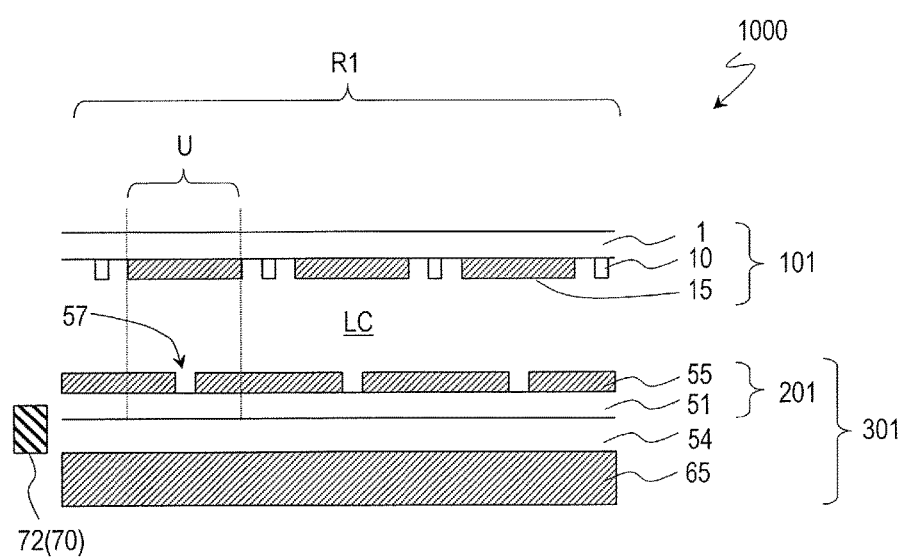
FIG. 1 A cross-sectional view schematically showing a part of a scanned antenna 1000 of a first embodiment.

Note that although the antenna elements of the scanned antenna according to an embodiment of the present invention are similar to pixels of an LCD panel, the structure of an antenna element is different from that of a pixel of an LCD panel, and the arrangement of antenna elements is different from the arrangement of pixels of in an LCD panel. Referring to FIG. 1, which shows a scanned antenna 1000 of a first embodiment to be later described in detail, the basic structure of a scanned antenna according to an embodiment of the present invention will be described. While the scanned antenna 1000 is a radial inline slot antenna including slots arranged in a concentric arrangement, the scanned antenna according to the embodiment of the present invention is not limited thereto, and the arrangement of slots may be any of various arrangements known in the art, for example.

FIG. 1 is a cross-sectional view schematically showing a portion of the scanned antenna 1000 of the present embodiment, schematically showing a portion of a cross section extending in the radial direction from a power feed pin 72

(see FIG. 2(b)) provided at around the center of slots arranged in a concentric arrangement.

The scanned antenna 1000 includes a TFT substrate 101, a slot substrate 201, a liquid crystal layer LC arranged therebetween, and a reflective conductive plate 65 arranged so as to oppose the slot substrate 201 with an air layer 54 interposed therebetween. The scanned antenna 1000 transmits/receives microwaves from the TFT substrate 101 side.

The TFT substrate 101 includes a dielectric substrate 1, such as a glass substrate, and a plurality of patch electrodes 15 and a plurality of TFTs 10 formed on the dielectric substrate 1. The patch electrodes 15 are connected to the corresponding TFTs 10. Each TFT 10 is connected to a gate bus line and a source bus line.

The slot substrate 201 includes a dielectric substrate 51, such as a glass substrate, and a slot electrode 55 formed on the liquid crystal layer LC side of the dielectric substrate 51. The slot electrode 55 includes a plurality of slots 57.

The reflective conductive plate 65 is arranged so as to oppose the slot substrate 201 with the air layer 54 interposed therebetween. A layer formed by a dielectric (e.g., a fluororesin such as PTFE) having a small dielectric constant M for microwaves can be used instead of the air layer 54. The slot electrode 55, the reflective conductive plate 65, and the dielectric substrate 51 and the air layer 54 therebetween together function as a waveguide 301.

Figure 16:
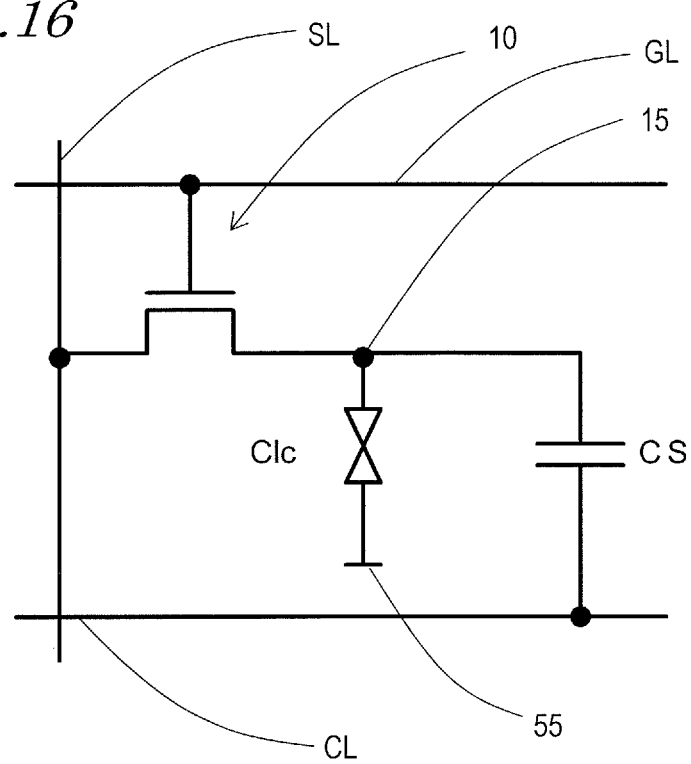
FIG. 16 A diagram showing an equivalent circuit of one antenna element of a scanned antenna according to an embodiment of the present invention.

The patch electrode 15, a portion of the slot electrode 55 including the slot 57, and the liquid crystal layer LC therebetween together form the antenna element U. In each antenna element U, one patch electrode 15 opposes a portion of the slot electrode 55 including one slot 57 with the liquid crystal layer LC interposed therebetween, thereby forming a liquid crystal capacitor. The structure in which the patch electrode 15 and the slot electrode 55 oppose each other with the liquid crystal layer LC interposed therebetween is similar to the structure in which the pixel electrode 914 and the counter electrode 924 of the LCD panel 900a oppose each other with the liquid crystal layer 930 interposed therebetween shown in FIG. 20. That is, the antenna element U of the scanned antenna 1000 has a similar structure to that of the pixel P of the LCD panel 900a. Moreover, the antenna element has a similar structure to that of the pixel P of the LCD panel 900a in that it includes a storage capacitor (see FIG. 13(a), FIG. 16) connected electrically parallel to the liquid crystal capacitor. However, the scanned antenna 1000 has many differences from the LCD panel 900a.

First, the capacity required for the dielectric substrates 1 and 51 of the scanned antenna 1000 is different from that required for substrates of an LCD panel.

Typically, an LCD panel uses substrates that are transparent to visible light, e.g., a glass substrate or a plastic substrate. In a reflective-type LCD panel, the substrate on the back side needs no transparency, and therefore a semiconductor substrate may be used. In contrast, the dielectric substrates 1 and 51 of an antenna preferably have a small dielectric loss for microwaves (the dielectric loss tangent for microwaves will be denoted as tan $\delta_M$). Tan $\delta_M$ of the dielectric substrates 1 and 51 is preferably about 0.03 or less, and more preferably 0.01 or less. Specifically, a glass substrate or a plastic substrate may be used. A glass substrate has a better dimensional stability and a better heat resistance than a plastic substrate, and it is suitable for cases in which circuit elements such as TFTs, lines and electrodes are formed by using the LCD technology. For example, when the materials forming the waveguide are the air and a glass, it is preferably 400 μm or less and more preferably 300 μm or less since a glass has a greater dielectric loss and the waveguide loss can be reduced as the glass is thinner. There is no particular lower limit as long as it can be handled without being cracked during the manufacturing process.

The conductive material used for the electrode also varies. An ITO film is often used as the transparent conductive film for the pixel electrode and the counter electrode of an LCD panel. However, ITO has a large tan $\delta_M$ for microwaves, and it cannot be used as the conductive layer in an antenna. The slot electrode 55 functions as a wall of the waveguide 301, together with the reflective conductive plate 65. Therefore, in order to suppress the transmission of microwaves through the wall of the waveguide 301, the thickness of the wall of the waveguide 301, i.e., the thickness of the metal layer (a Cu layer or an Al layer), is preferably large. It is known in the art that the electromagnetic wave is attenuated to 1/20 (−26 dB) when the thickness of the metal layer is three times the skin depth, and the electromagnetic wave is attenuated to about 1/150 (−43 dB) when it is five times the skin depth. Therefore, it is possible to reduce the transmittance of electromagnetic waves to 1% if the thickness of the metal layer is five times the skin depth. For 10 GHz microwaves, for example, it is possible to reduce the microwaves to 1/150 by using a Cu layer whose thickness is 3.3 μm or more and an Al layer whose thickness is 4.0 μm or more. For 30 GHz microwaves, it is possible to reduce the microwaves to 1/150 by using a Cu layer whose thickness is 1.9 μm or more and an Al layer whose thickness is 2.3 μm or more. Thus, the slot electrode 55 is preferably formed of a Cu layer or an Al layer which is relatively thick. There is no particular upper limit to the thickness of the Cu layer or the Al layer, and the thickness may be set appropriately in view of the deposition time and cost. Using a Cu layer gives an advantage that it can be made thinner than when an Al layer is used. For the formation of a Cu layer or an Al layer which is relatively thick, it is possible to employ not only the thin film deposition method used in LCD manufacturing processes, but also other methods such as attaching a Cu foil or an Al foil to the substrate. The thickness of the metal layer is 2 μm or more and 30 μm or less, for example. When it is formed by using the thin film deposition method, the thickness of the metal layer is preferably 5 μm or less. Note that the reflective conductive plate 65 may be an aluminum plate, a copper plate, or the like, having a thickness of some mm, for example.

In order to avoid a loss that transforms into heat when the oscillation of free electrons near slots is induced into the oscillation of free electrons in the patch electrode, it is preferred that the patch electrode 15 has a low sheet resistance, but it may be a Cu layer or an Al layer whose thickness is smaller than the slot electrode 55 because it does not form the waveguide 301 as does the slot electrode 55. In view of mass production, it is preferred to use an Al layer, and the thickness of the Al layer is preferably 1 μm to 2 μm, for example.

The pitch with which the antenna elements U are arranged is significantly different from the pixel pitch. For example, for an antenna for 12 GHz (Ku band) microwaves, the wavelength λ is 25 mm, for example. Then, as described in Patent Document No. 4, the pitch of the antenna elements U is λ/4 or less and/or λ/5 or less, i.e., 6.25 mm or less and/or 5 mm or less. This is 10 times or more the pitch of the pixels of an LCD panel. Thus, the length and the width of the antenna elements U are about 10 times those of the pixel lengths of an LCD panel.

It is understood that the arrangement of the antenna elements U may be different from the arrangement of pixels in an LCD panel. An example of a concentric arrangement (see, for example, Japanese Laid-Open Patent Publication No. 2002-217640) will be illustrated herein, but the arrangement is not limited thereto, and it may be a spiral arrangement as described in Non-Patent Document No. 2, for example. Moreover, it may be a matrix arrangement as described in Patent Document No. 4.

Characteristics required for the liquid crystal material of the liquid crystal layer LC of the scanned antenna 1000 are different from those required for the liquid crystal material of an LCD panel. An LCD panel produces display by giving a phase difference to the polarization of visible light (wavelength 380 nm to 830 nm) by changing the refractive index of the liquid crystal layer of each pixel, thereby changing the polarization thereof (e.g., rotating the polarization axis direction of linearly-polarized light or changing the degree of circular polarization of circularly-polarized light). In contrast, the scanned antenna 1000 according to the embodiment varies the phase of the microwave to be driven (re-radiated) from each patch electrode by changing the static capacitance value of the liquid crystal capacitor of the antenna element U. Therefore, with a liquid crystal layer, the anisotropy (ARM) of the dielectric constant $M(\varepsilon_M)$ for microwaves is preferably large, and tan $\delta_M$ is preferably small. For example, one whose $\Delta\varepsilon_M$ is 4 or more and whose tan $\delta_M$ is 0.02 or less (each being a value for 9 Gz) described in M. Wittek et al., SID 2015 DIGEST, pp. 824-826 can suitably be used. In addition, a liquid crystal material whose $\Delta\varepsilon_M$ is 0.4 or more and whose tan $\delta_M$ is 0.04 or less described in Kuki, Polymer, vol. 55, August issue, pp. 599-602 (2006) can be used.

Typically, the dielectric constant of a liquid crystal material has a frequency dispersion, but the dielectric anisotropy $\Delta\varepsilon_M$ for microwaves has a positive correlation with the refractive index anisotropy $\Delta n$ for visible light. Therefore, it can be said that a liquid crystal material of an antenna element for microwaves is preferably a material having a large refractive index anisotropy $\Delta n$ for visible light. The refractive index anisotropy $\Delta n$ of a liquid crystal material for an LCD is evaluated by the refractive index anisotropy for light of 550 nm. Also using $\Delta n$ (birefringence) for light of 550 nm herein as the index, a nematic liquid crystal whose $\Delta n$ is 0.3 or more, preferably 0.4 or more, can be used for an antenna element for microwaves. There is no particular upper limit to $\Delta n$. Note however that a liquid crystal material having a large $\Delta n$ tends to have a strong polarity, and may possibly lower the reliability. In view of the reliability, $\Delta n$ is preferably 0.4 or less. The thickness of the liquid crystal layer is 5 µm to 500 µm, for example.

The structure of a scanned antenna according to an embodiment of the present invention and a method for manufacturing the same will now be described in detail.

First Embodiment

Figure 2:
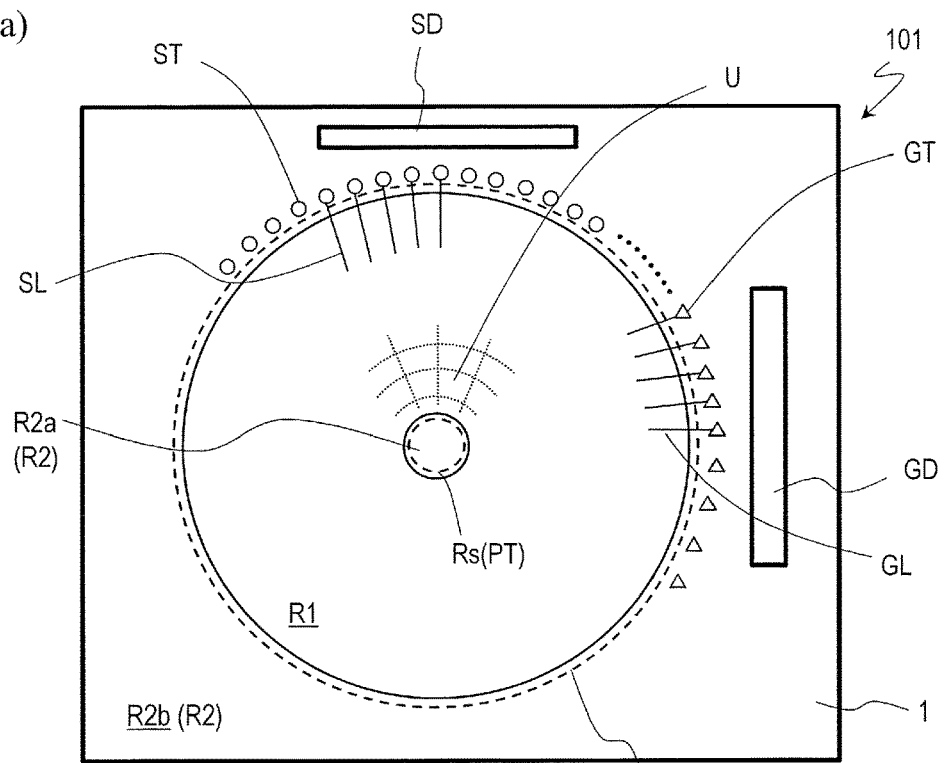
FIG. 2(a) and (b) are schematic plan views showing a TFT substrate 101 and a slot substrate 201, respectively, of the scanned antenna 1000.
Figure 2:
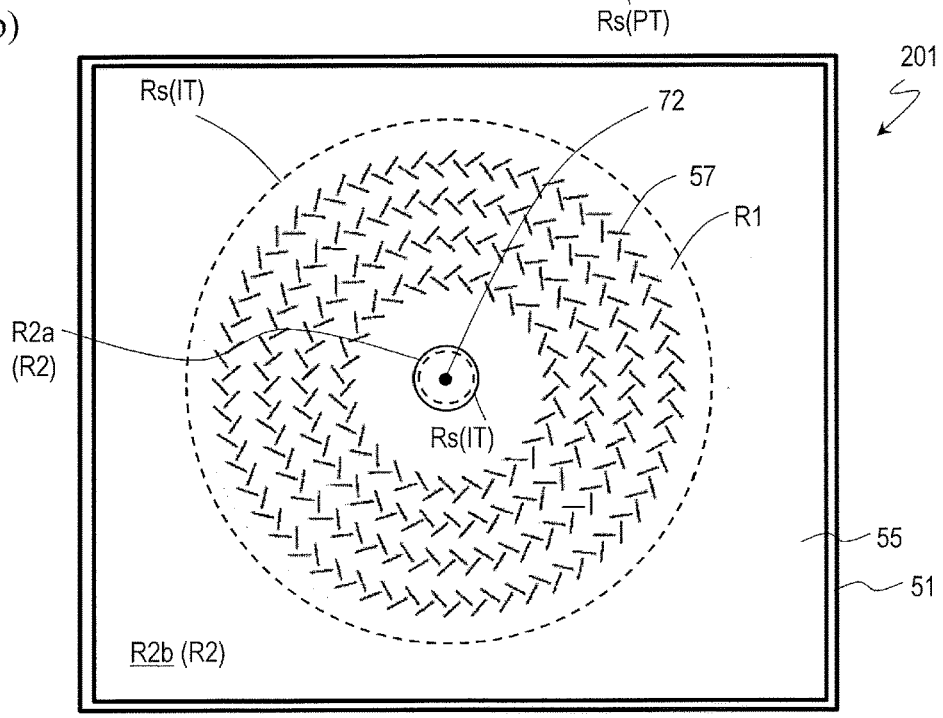

First, reference will be made to FIG. 1 and FIG. 2. FIG. 1 is a schematic partial cross-sectional view at around the center of the scanned antenna 1000 as described in detail above, and FIGS. 2(a) and 2(b) are schematic plan views showing the TFT substrate 101 and the slot substrate 201, respectively, of the scanned antenna 1000.

The scanned antenna 1000 includes a plurality of antenna elements U arranged in a two-dimensional arrangement, and the scanned antenna 1000 illustrated herein includes a plurality of antenna elements arranged in a concentric arrangement. In the following description, the region of the TFT substrate 101 or the slot substrate 201 corresponding to the antenna element U will be referred to as an "antenna element region" and will be denoted by the same reference sign U as the antenna element. As shown in FIGS. 2(a) and 2(b), in the TFT substrate 101 and the slot substrate 201, a region defined by a plurality of antenna element regions arranged in a two-dimensional arrangement will be referred to as a "transmitting/receiving region R1", and regions other than the transmitting/receiving region R1 will be referred to as "non-transmitting/receiving regions R2". A terminal portion, a driving circuit, etc., are provided in the non-transmitting/receiving regions R2.

FIG. 2(a) is a schematic plan view showing the TFT substrate 101 of the scanned antenna 1000.

In the illustrated example, as seen from the direction normal to the TFT substrate 101, the transmitting/receiving region R1 is donut-shaped. The non-transmitting/receiving regions R2 include a first non-transmitting/receiving region R2a located at the center portion of the transmitting/receiving region R1 and a second non-transmitting/receiving region R2b located at the peripheral portion of the transmitting/receiving region R1. The outer diameter of the transmitting/receiving region R1 is 200 mm to 1500 mm, for example, and may be set based on the traffic volume, or the like.

The transmitting/receiving region R1 of the TFT substrate 101 includes a plurality of gate bus lines GL and a plurality of source bus lines SL supported on the dielectric substrate 1, and the antenna element regions U are defined by these lines. The antenna element regions U are arranged in a concentric arrangement, for example, in the transmitting/receiving region R1. Each of the antenna element regions U includes a TFT, and a patch electrode electrically connected to the TFT. The source electrode of a TFT and the gate electrode thereof are electrically connected to the source bus line SL and the gate bus line GL, respectively. The drain electrode is electrically connected to the patch electrode.

A seal region Rs is arranged in the non-transmitting/receiving region R2 (R2a, R2b) so as to surround the transmitting/receiving region R1. A sealant (not shown) is provided in the seal region Rs. The sealant bonds together the TFT substrate 101 and the slot substrate 201, and also seals the liquid crystal between these substrates 101 and 201.

The gate terminal portion GT, the gate driver GD, the source terminal portion ST and the source driver SD are provided in the non-transmitting/receiving region R2 outside the seal region Rs. The gate bus lines GL are connected to the gate driver GD via the gate terminal portions GT. The source bus lines SL are connected to the source driver SD via the source terminal portions ST. Note that although the source driver SD and the gate driver GD are formed on the dielectric substrate 1 in this example, one or both of these drivers may be provided on another dielectric substrate.

A plurality of transfer terminal portions PT are also provided in the non-transmitting/receiving region R2. The transfer terminal portions PT are electrically connected to the slot electrode 55 of the slot substrate 201 (FIG. 2(b)). In the present specification, the connecting portion between the transfer terminal portion PT and the slot electrode 55 will be referred to as a "transfer portion". As shown in the figure, the transfer terminal portions PT (transfer portions) may be arranged in the seal region Rs. In this case, a resin containing conductive particles therein may be used as the sealant. Thus, it is possible to seal the liquid crystal between the TFT substrate 101 and the slot substrate 201, and to ensure an electrical connection between the transfer terminal portion PT and the slot electrode 55 of the slot substrate 201. Although the transfer terminal portions PT are arranged both in the first non-transmitting/receiving region R2a and in the second non-transmitting/receiving region R2b in this example, the transfer terminal portions PT may be arranged either one of these regions.

Note that the transfer terminal portions PT (transfer portions) may not be arranged in the seal region Rs. For example, they may be arranged outside the seal region Rs in the non-transmitting/receiving region R2.

FIG. 2(b) is a schematic plan view illustrating the slot substrate 201 of the scanned antenna 1000, showing the liquid crystal layer LC side surface of the slot substrate 201.

On the slot substrate 201, the slot electrode 55 is formed on the dielectric substrate 51 across the transmitting/receiving region R1 and the non-transmitting/receiving region R2.

A plurality of slots 57 are arranged in the slot electrode 55 in the transmitting/receiving region R1 of the slot substrate 201. The slots 57 are arranged so as to correspond to the antenna element regions U on the TFT substrate 101. In the illustrated example, pairs of slots 57 are arranged in a concentric arrangement, each pair including slots 57 extending in directions generally orthogonal to each other so as to implement a radial inline slot antenna. Having slots generally orthogonal to each other, the scanned antenna 1000 is capable of transmitting/receiving circularly-polarized waves.

A plurality of terminal portions IT of the slot electrode 55 are provided in the non-transmitting/receiving region R2. The terminal portions IT are electrically connected to the transfer terminal portions PT of the TFT substrate 101 (FIG. 2(a)). In this example, the terminal portions IT are arranged in the seal region Rs, and are electrically connected to the corresponding transfer terminal portions PT by a sealant containing conductive particles therein.

In the first non-transmitting/receiving region R2a, the power feed pin 72 is arranged on the reverse side of the slot substrate 201. With the power feed pin 72, microwaves are inserted into the waveguide 301 formed by the slot electrode 55, the reflective conductive plate 65 and the dielectric substrate 51. The power feed pin 72 is connected to a power feed device 70. The power is fed from the center of the concentric arrangement in which the slots 57 are arranged. The power feeding method may be either a direct power feed method or an electromagnetic coupling method, and a power feed structure known in the art can be employed.

Various elements of the scanned antenna 1000 will now be described in greater detail with reference to the drawings.

<Structure of TFT Substrate 101>

Antenna Element Region U

FIGS. 3(a) and 3(b) are a cross-sectional view and a plan view, respectively, schematically showing the antenna element region U of the TFT substrate 101.

Each of the antenna element regions U includes a dielectric substrate (not shown), the TFT 10 supported on the dielectric substrate, a first insulating layer 11 covering the TFT 10, the patch electrode 15 formed on the first insulating layer 11 and electrically connected to the TFT 10, and a second insulating layer 17 covering the patch electrode 15. The TFT 10 is arranged in the vicinity of the intersection between the gate bus line GL and the source bus line SL, for example.

The TFT 10 includes a gate electrode 3, an island-shaped semiconductor layer 5, a gate insulating layer 4 arranged between the gate electrode 3 and the semiconductor layer 5, and a source electrode 7S and a drain electrode 7D. There is no particular limitation on the structure of the TFT 10. In this example, the TFT 10 is a channel-etched-type TFT having a bottom gate structure.

The gate electrode 3 is electrically connected to the gate bus line GL, and receives a scanning signal supplied from the gate bus line GL. The source electrode 7S is electrically connected to the source bus line SL, and receives a data signal supplied from the source bus line SL. The gate electrode 3 and the gate bus line GL may be formed of the same conductive film (gate conductive film). The source electrode 7S, the drain electrode 7D and the source bus line SL may be formed of the same conductive film (source conductive film). The gate conductive film and the source conductive film are metal films, for example. In the present specification, a layer formed by using a gate conductive film may be referred to as a "gate metal layer", and a layer formed by using a source conductive film as a "source metal layer".

The semiconductor layer 5 is arranged so as to be laid over the gate electrode 3 with the gate insulating layer 4 interposed therebetween. In the illustrated example, a source contact layer 6S and a drain contact layer 6D are formed on the semiconductor layer 5. The source contact layer 6S and the drain contact layer 6D are arranged on both sides of a region (channel region) of the semiconductor layer 5 in which the channel is formed. The semiconductor layer 5 may be an intrinsic amorphous silicon (i-a-Si) layer, and the source contact layer 6S and the drain contact layer 6D may be an $n^+$-type amorphous silicon ($n^+$-a-Si) layer.

The source electrode 7S is provided so as to be in contact with the source contact layer 6S, and is connected to the semiconductor layer 5 via the source contact layer 6S. The drain electrode 7D is provided so as to be in contact with the drain contact layer 6D, and is connected to the semiconductor layer 5 via the drain contact layer 6D.

The first insulating layer 11 includes a contact hole CH1 that reaches the drain electrode 7D of the TFT 10.

The patch electrode 15 is provided on the first insulating layer 11 and in the contact hole CH1, and is in contact with the drain electrode 7D in the contact hole CH1. The patch electrode 15 includes a metal layer. The patch electrode 15 may be a metal electrode formed only from a metal layer. The material of the patch electrode 15 may be the same as the source electrode 7S and the drain electrode 7D. Note however that the thickness of the metal layer in the patch electrode 15 (the thickness of the patch electrode 15 if the patch electrode 15 is a metal electrode) is set so as to be greater than the thickness of the source electrode 7S and the drain electrode 7D. The preferred thickness of the metal layer of the patch electrode 15 is dictated by the skin effect as described above, and varies depending on the frequency of electromagnetic waves to be transmitted or received, the material of the metal layer, etc. The thickness of the metal layer in the patch electrode 15 is set to be 1 µm or more, for example.

A CS bus line CL may be provided using the same conductive film as the gate bus line GL. The CS bus line CL may be arranged so as to be laid over the drain electrode (or the extension of the drain electrode) 7D with the gate insulating layer 4 interposed therebetween, thereby forming the storage capacitor CS using the gate insulating layer 4 as the dielectric layer.

An alignment mark (e.g., a metal layer) 21 and a base insulating layer 2 covering the alignment mark 21 may be formed on the dielectric substrate side with respect to the gate bus line GL. Regarding the alignment mark 21, where m sheets of TFT substrate are to be produced from a single sheet of glass substrate, if the number of sheets of photomask is n (n<m), each exposure step needs to be performed over a plurality of iterations. It is used for the alignment of a photomask when the number (n) of sheets of photomask is smaller than the number (m) of sheets of the TFT substrate 101 to be produced from a single sheet of glass substrate 1. The alignment mark 21 may be optional.

In the present embodiment, the patch electrode 15 is formed in a layer different from the source metal layer. This gives the following advantage.

Since the source metal layer is normally formed by using a metal film, one may consider forming the patch electrode in the source metal layer (a TFT substrate of a reference example). However, it is formed by using a metal film having a relatively large thickness (e.g., about 2 µm or more) because the patch electrode reflects electromagnetic waves. Therefore, with the TFT substrate of the reference example, the source bus line SL, etc., are also formed of such a metal film having a large thickness, thereby reducing the patterning controllability when forming the lines. In contrast, in the present embodiment, the patch electrode 15 is formed separately from the source metal layer, and it is therefore possible to independently control the thickness of the source metal layer and the thickness of the patch electrode 15. Therefore, it is possible to form the patch electrode 15 having a desired thickness while ensuring the controllability when forming the source metal layer.

In the present embodiment, the thickness of the patch electrode 15 can be set, with a high degree of freedom, separately from the thickness of the source metal layer. Note that the size of the patch electrode 15 does not need to be controlled as strictly as the source bus line SL, etc., and the line width shift (the shift from the design value) can increase, without problems, by increasing the thickness of the patch electrode 15.

The patch electrode 15 may include a Cu layer or an Al layer as the main layer. The thickness of the main layer is set so that a desired electromagnetic wave collection efficiency is realized. A study by the present inventor shows that the electromagnetic wave collection efficiency is dependent on the electric resistance value, and a Cu layer is potentially more capable of reducing the thickness of the patch electrode 15 than an Al layer.

Gate Terminal Portion GT, Source Terminal Portion ST and Transfer Terminal Portion PT FIG. 4(a) to (c) are cross-sectional views schematically showing the gate terminal portion GT, the source terminal portion ST and the transfer terminal portion PT, respectively.

The gate terminal portion GT includes the gate bus line GL formed on the dielectric substrate, an insulating layer covering the gate bus line GL, and a gate terminal upper connecting portion 19g. The gate terminal upper connecting portion 19g is in contact with the gate bus line GL in a contact hole CH2 formed in the insulating layer. In this example, the insulating layer covering the gate bus line GL includes the gate insulating layer 4, the first insulating layer 11 and the second insulating layer 17 from the dielectric substrate side. The gate terminal upper connecting portion 19g is a transparent electrode formed of a transparent conductive film provided on the second insulating layer 17, for example.

The source terminal portion ST includes the source bus line SL formed on the dielectric substrate (herein, on the gate insulating layer 4), an insulating layer covering the source bus line SL, and a source terminal upper connecting portion 19s. The source terminal upper connecting portion 19s is in contact with the source bus line SL in a contact hole CH3 formed in the insulating layer. In this example, the insulating layer covering the source bus line SL includes the first insulating layer 11 and the second insulating layer 17. The source terminal upper connecting portion 19s is a transparent electrode formed of a transparent conductive film provided on the second insulating layer 17, for example.

The transfer terminal portion PT includes a patch connecting portion 15p formed on the first insulating layer 11, the second insulating layer 17 covering the patch connecting portion 15p, and a transfer terminal upper connecting portion 19p. The transfer terminal upper connecting portion 19p is in contact with the patch connecting portion 15p in a contact hole CH4 formed in the second insulating layer 17. The patch connecting portion 15p is formed of the same conductive film as the patch electrode 15. The transfer terminal upper connecting portion (referred to also as an upper transparent electrode) 19p is a transparent electrode formed of a transparent conductive film provided on the second insulating layer 17, for example. In the present embodiment, the upper connecting portions 19g, 19s and 19p of different terminal portions are formed of the same transparent conductive film.

The present embodiment has an advantage in that the contact holes CH2, CH3 and CH4 of different terminal portions can be formed simultaneously in an etching step after the formation of the second insulating layer 17. The detailed manufacturing process will be described later.

<Method for Manufacturing TFT Substrate 101>

Figure 5:
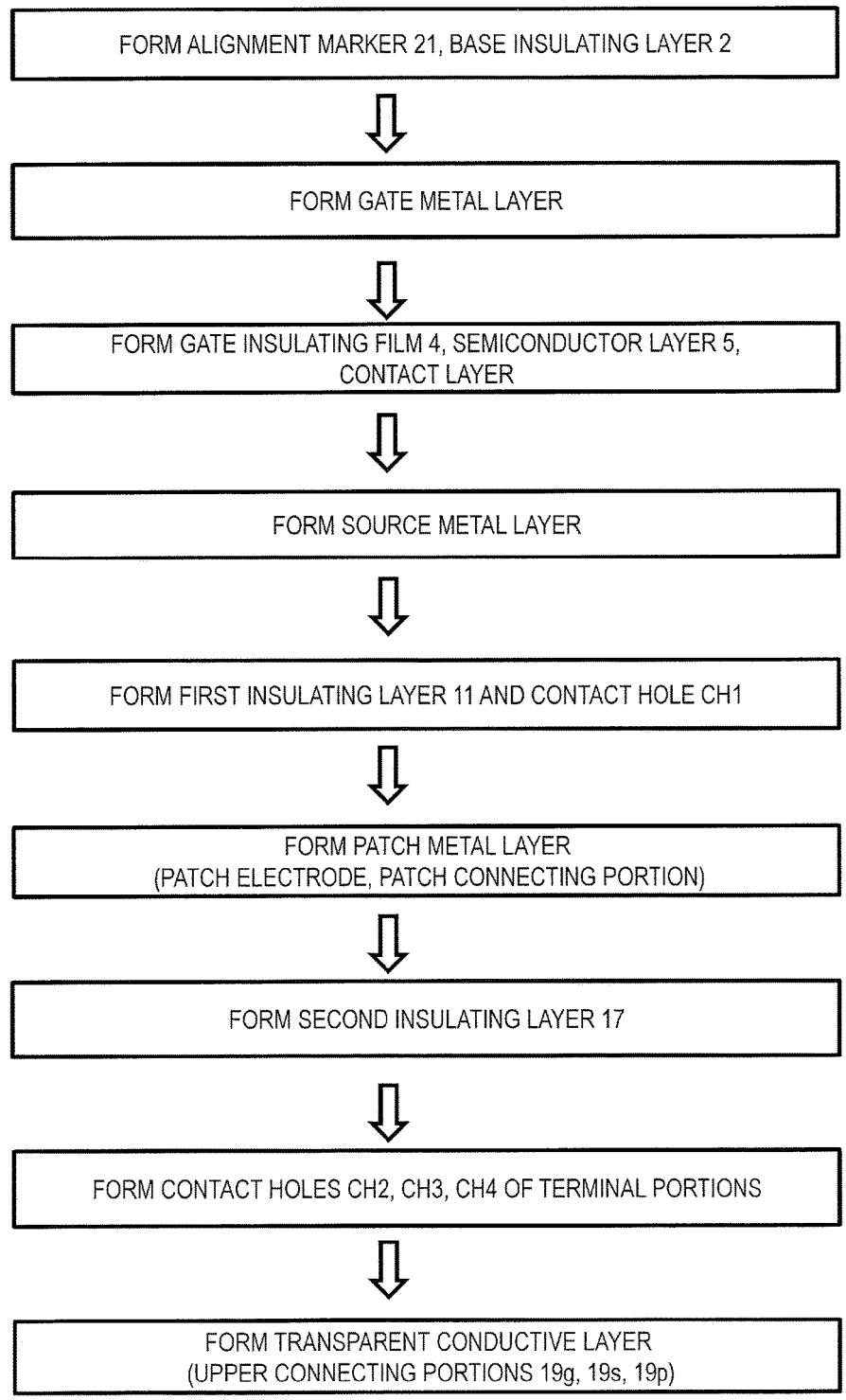
FIG. 5A diagram showing example steps of manufacturing the TFT substrate 101.

The TFT substrate 101 can be manufactured by the following method, for example. FIG. 5 is a diagram illustrating steps for manufacturing the TFT substrate 101.

First, a metal film (e.g., a Ti film) is formed on the dielectric substrate and is patterned to thereby form the alignment mark 21. The dielectric substrate may be a glass substrate, a heat-resistant plastic substrate (resin substrate), etc., for example. Then, the base insulating layer 2 is formed so as to cover the alignment mark 21. An $SiO_2$ film, for example, is used as the base insulating layer 2.

Then, a gate metal layer including the gate electrode 3 and the gate bus line GL is formed on the base insulating layer 2.

The gate electrode 3 can be formed integral with the gate bus line GL. Herein, a gate conductive film (thickness: 50 nm or more and 500 nm or less, for example) is formed on the dielectric substrate by a sputtering method, or the like. Then, the gate conductive film is patterned to obtain the gate electrode 3 and the gate bus line GL. There is no particular limitation on the material of the gate conductive film. It may suitably be a film containing a metal such as aluminum (Al), tungsten (W), molybdenum (Mo), tantalum (Ta), chromium (Cr), titanium (Ti) and copper (Cu), or an alloy thereof, or a metal nitride thereof. Herein, a layered film in which MoN (thickness: 50 nm, for example), Al (thickness: 200 nm, for example) and MoN (thickness: 50 nm, for example) are layered in this order is formed as the gate conductive film.

Then, the gate insulating layer 4 is formed so as to cover the gate metal layer. The gate insulating layer 4 may be formed by a CVD method, or the like. The gate insulating layer 4 may suitably be a silicon oxide ($SiO_2$) layer, a silicon nitride (SiNx) layer, a silicon oxide nitride layer (SiOxNy; x>y) layer, a silicon nitride oxide (SiNxOy; x>y) layer, or the like. The gate insulating layer 4 may have a layered structure. Herein, an SiNx layer (thickness: 410 nm, for example) is formed as the gate insulating layer 4.

Then, the semiconductor layer 5 and a contact layer are formed on the gate insulating layer 4. Herein, an intrinsic amorphous silicon film (thickness: 125 nm, for example) and an $n^+$-type amorphous silicon film (thickness: 65 nm, for example) are formed in this order and patterned to thereby obtain the island-shaped semiconductor layer 5 and the contact layer. The semiconductor film used for the semiconductor layer 5 is not limited to an amorphous silicon film. For example, an oxide semiconductor layer may be formed as the semiconductor layer 5. In such a case, the contact layer does not need to be provided between the semiconductor layer 5 and the source-drain electrode.

Then, a source conductive film (thickness: 50 nm or more and 500 nm or less, for example) is formed on the gate insulating layer 4 and on the contact layer and is patterned to thereby form a source metal layer including the source electrode 7S, the drain electrode 7D and the source bus line SL. In this process, the contact layer is also etched, thereby forming the source contact layer 6S and the drain contact layer 6D, which are separated from each other.

There is no particular limitation on the material of the source conductive film. It may suitably be a film containing a metal such as aluminum (Al), tungsten (W), molybdenum (Mo), tantalum (Ta), chromium (Cr), titanium (Ti) and copper (Cu), or an alloy thereof, or a metal nitride thereof. Herein, a layered film in which MoN (thickness: 30 nm, for example), Al (thickness: 200 nm, for example) and MoN (thickness: 50 nm, for example) are layered in this order is formed as the source conductive film.

Herein, a source conductive film is formed by a sputtering method, and the source conductive film is patterned (source-drain separation) by wet etching. Then, a portion of the contact layer that is located over a region of the semiconductor layer 5 to be the channel region is removed by dry etching, for example, thereby forming a gap portion, achieving a separation between the source contact layer 6S and the drain contact layer 6D. In this process, in the gap portion, a near-surface portion of the semiconductor layer 5 is also etched (overetching).

Note that when a layered film including a Ti film and an Al film layered in this order is used as the source conductive film, for example, the Al film may be patterned by wet etching using an aqueous solution containing phosphoric acid, acetic acid and nitric acid, for example, and then the Ti film and the contact layer ($n^+$-type amorphous silicon layer) 6 may be patterned simultaneously by dry etching. Alternatively, the source conductive film and the contact layer may be etched in a single step. Note however that when the source conductive film (or an underlying layer thereof) and the contact layer 6 are etched simultaneously, it may become difficult to control the distribution of the etching amount of the semiconductor layer 5 (the amount by which the gap portion is dug) across the entire substrate. In contrast, when the source-drain separation and the gap portion formation are performed in separate etching steps as described above, it is possible to more easily control the etching amount of the gap portion.

Then, the first insulating layer 11 is formed so as to cover the TFT 10. In this example, the first insulating layer 11 is arranged so as to be in contact with the channel region of the semiconductor layer 5. Using a known photolithography, the contact hole CH1 that reaches the drain electrode 7D is formed in the first insulating layer 11.

The first insulating layer 11 may be an inorganic insulating layer such as a silicon oxide ($SiO_2$) film, a silicon nitride (SiNx) film, a silicon oxide nitride (SiOxNy; x>y) film or a silicon nitride oxide (SiNxOy; x>y) film, for example. Herein, an SiNx layer having a thickness of 330 nm, for example, is formed by a CVD method, for example, as the first insulating layer 11.

Then, a patch conductive film is formed on the first insulating layer 11 and in the contact hole CH1, and is patterned. Thus, the patch electrode 15 is formed in the transmitting/receiving region R1, and the patch connecting portion 15p is formed in the non-transmitting/receiving region R2. The patch electrode 15 is in contact with the drain electrode 7D in the contact hole CH1. Note that in the present specification, a layer that is formed of a patch conductive film and that includes the patch electrode 15 and the patch connecting portion 15p may be referred to as a "patch metal layer".

The material of the patch conductive film may be the same material as the gate conductive film or the source conductive film. Note however that the patch conductive film is set to be thicker than the gate conductive film and the source conductive film. Thus, by suppressing the electromagnetic wave transmittance and reducing the sheet resistance of the patch electrode, it is possible to reduce the loss in which oscillation of free electrons in the patch electrode is transformed into heat. A preferred thickness of the patch conductive film is 1 μm or more and 30 μm or less, for example. Thinner than this, the electromagnetic wave transmittance will be about 30% and the sheet resistance will be 0.03 Ω/sq or more, thereby possibly increasing the loss; and thicker than this, the slot patternability may possibly deteriorate.

Herein, a layered film (MoN/Al/MoN) including MoN (thickness: 50 nm, for example), Al (thickness: 1000 nm, for example) and MoN (thickness: 50 nm, for example) layered in this order is formed as the patch conductive film. Note that it may alternatively be a layered film (Ti/Cu/Ti) including a Ti film, a Cu film and a Ti film layered in this order, or a layered film (Cu/Ti) including a Ti film and a Cu film layered in this order.

Then, the second insulating layer (thickness: 100 nm or more and 300 nm or less, for example) 17 is formed on the patch electrode 15 and the first insulating layer 11. There is no particular limitation on the second insulating layer 17, and it may suitably be a silicon oxide ($SiO_2$) film, a silicon nitride (SiNx) film, a silicon oxide nitride (SiOxNy; x>y) film, a silicon nitride oxide (SiNxOy; x>y) film, or the like, for example. Herein, an SiNx layer having a thickness of 200 nm, for example, is formed as the second insulating layer 17.

Then, the inorganic insulating films (the second insulating layer 17, the first insulating layer 11 and the gate insulating layer 4) are etched in a single step by dry etching using a fluorine-based gas, for example. In the etching, the patch electrode 15, the source bus line SL and the gate bus line GL each function as an etch stop. Thus, the contact hole CH2 that reaches the gate bus line GL is formed in the second insulating layer 17, the first insulating layer 11 and the gate insulating layer 4, and the contact hole CH3 that reaches the source bus line SL is formed in the second insulating layer 17 and the first insulating layer 11. The contact hole CH4 that reaches the patch connecting portion 15p is formed in the second insulating layer 17.

In this example, since the inorganic insulating films are etched in a single step, the side surfaces of the second insulating layer 17, the first insulating layer 11 and the gate insulating layer 4 are aligned together on the side wall of the resultant contact hole CH2, and the side walls of the second insulating layer 17 and the first insulating layer 11 are aligned together on the side wall of the contact hole CH3. Note that as used in the present specification, "side surfaces of two or more different layers being aligned together" in a contact hole not only means that the side surfaces of these layers exposed in the contact hole are flush with each other in the vertical direction, but also includes a case where the side surfaces extend successively together to form a slope, e.g., a tapered shape. Such a configuration can be obtained by etching these layers using the same mask or by etching one layer using the other layer as a mask, for example.

Then, a transparent conductive film (thickness: 50 nm or more and 200 nm or less) is formed by a sputtering method, for example, on the second insulating layer 17 and in the contact holes CH2, CH3 and CH4. The transparent conductive film may be an ITO (indium tin oxide) film, an IZO film, a ZnO film (zinc oxide film), or the like, for example. Herein, an ITO film having a thickness of 100 nm, for example, is used as the transparent conductive film.

Then, the transparent conductive film is patterned, thereby forming the gate terminal upper connecting portion 19g, the source terminal upper connecting portion 19s and the transfer terminal upper connecting portion 19p. The gate terminal upper connecting portion 19g, the source terminal upper connecting portion 19s and the transfer terminal upper connecting portion 19p are used to protect electrodes and lines that are exposed on the terminal portions. Thus, the gate terminal portion GT, the source terminal portion ST and the transfer terminal portion PT are obtained.

<Structure of Slot Substrate 201>

Next, the structure of the slot substrate 201 will be described in greater detail.

Figure 6:
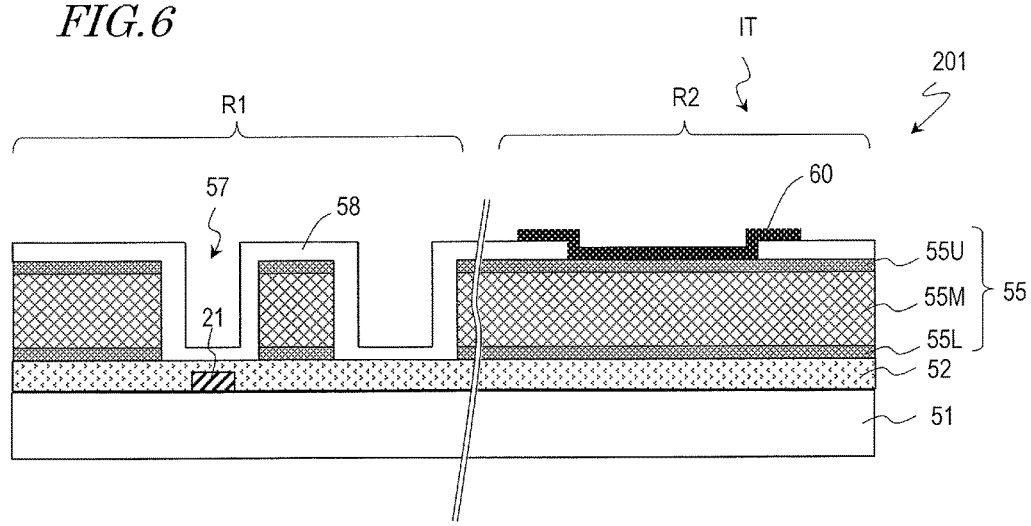
FIG. 6A cross-sectional view schematically showing the antenna element region U and a terminal portion IT of the slot substrate 201.

FIG. 6 is a cross-sectional view schematically showing the antenna element region U and the terminal portion IT of the slot substrate 201.

The slot substrate 201 includes the dielectric substrate 51 having a front surface and a reverse surface, a third insulating layer 52 formed on the front surface of the dielectric substrate 51, the slot electrode 55 formed on the third insulating layer 52, and a fourth insulating layer 58 covering the slot electrode 55. The reflective conductive plate 65 is arranged so as to oppose the reverse surface of the dielectric substrate 51 with the dielectric layer (air layer) 54 interposed therebetween. The slot electrode 55 and the reflective conductive plate 65 each function as a wall of the waveguide 301.

In the transmitting/receiving region R1, a plurality of slots 57 are formed in the slot electrode 55. The slots 57 are openings running through the slot electrode 55. In this example, one slot 57 is arranged in each antenna element region U.

The fourth insulating layer 58 is formed on the slot electrode 55 and in the slot 57. The material of the fourth insulating layer 58 may be the same material as the third insulating layer 52. By covering the slot electrode 55 with the fourth insulating layer 58, the slot electrode 55 and the liquid crystal layer LC are not in direct contact with each other, thus increasing the reliability. When the slot electrode 55 is formed of a Cu layer, Cu may elute into the liquid crystal layer LC. When the slot electrode 55 is formed of an Al layer using a thin film deposition technique, voids may be contained in the Al layer. The fourth insulating layer 58 is capable of preventing the liquid crystal material from entering the voids of the Al layer. Note that the problem of voids can be avoided if an aluminum foil, as the Al layer, is attached on the dielectric substrate 51 via an adhesive and is patterned to produce the slot electrode 55.

The slot electrode 55 includes a main layer 55M such as a Cu layer or an Al layer. The slot electrode 55 may have a layered structure including the main layer 55M, and an upper layer 55U and a lower layer 55L arranged so as to sandwich the main layer 55M therebetween. The thickness of the main layer 55M is set in view of the skin effect depending on the material, and it may be 2 μm or more and 30 μm or less, for example. The thickness of the main layer 55M is typically greater than the thickness of the upper layer 55U and the lower layer 55L.

In the illustrated example, the main layer 55M is a Cu layer, and the upper layer 55U and the lower layer 55L are each a Ti layer. By arranging the lower layer 55L between the main layer 55M and the third insulating layer 52, it is possible to improve the adhesion between the slot electrode 55 and the third insulating layer 52. By providing the upper layer 55U, it is possible to suppress the corrosion of the main layer 55M (e.g., a Cu layer).

Since the reflective conductive plate 65 forms a wall of the waveguide 301, it preferably has a thickness that is 3 times or more, preferably 5 times or more, the skin depth. The reflective conductive plate 65 may be an aluminum plate, a copper plate, or the like, that is produced by machining and has a thickness of some mm, for example.

The terminal portion IT is provided in the non-transmitting/receiving region R2. The terminal portion IT includes the slot electrode 55, the fourth insulating layer 58 covering the slot electrode 55, and an upper connecting portion 60. The fourth insulating layer 58 has an opening that reaches the slot electrode 55. In the opening, the upper connecting portion 60 is in contact with the slot electrode 55. In the present embodiment, the terminal portion IT is arranged in the seal region Rs, and is connected to the transfer terminal portion (transfer portion) of the TFT substrate via a seal resin containing conductive particles therein.

Transfer Portion

Figure 7:
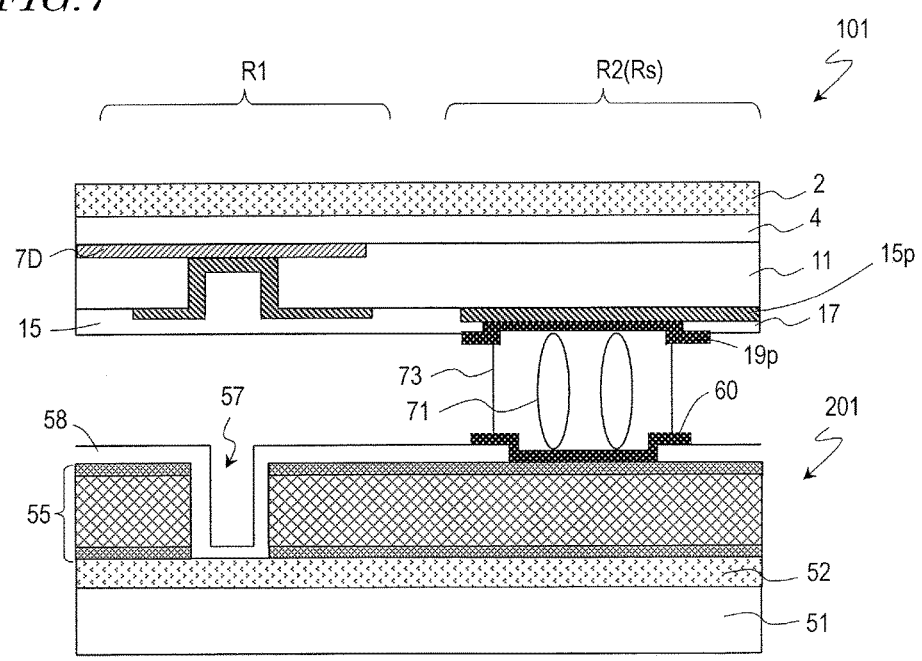
FIG. 7A schematic cross-sectional view illustrating a transfer portion of the TFT substrate 101 and the slot substrate 201.

FIG. 7 is a schematic cross-sectional view illustrating a transfer portion that connects together the transfer terminal portion PT of the TFT substrate 101 and the terminal portion IT of the slot substrate 201. In FIG. 7, like elements to those of FIG. 1 to FIG. 4 are denoted by like reference signs.

In the transfer portion, the upper connecting portion 60 of the terminal portion IT is electrically connected to the transfer terminal upper connecting portion 19p of the transfer terminal portion PT of the TFT substrate 101. In the present embodiment, the upper connecting portion 60 and the transfer terminal upper connecting portion 19p are connected together via a resin (seal resin) 73 containing conductive beads 71 therein (referred to also as a "seal portion 73").

Each of the upper connecting portions 60 and 19p is a transparent conductive layer such as an ITO film or an IZO film, and an oxide film may be formed on the surface thereof. When an oxide film is formed, an electrical connection between the transparent conductive layers may possibly not be ensured, thereby increasing the contact resistance. In contrast, in the present embodiment, these transparent conductive layers are bonded via a resin containing the conductive beads (e.g., Au beads) 71 therein. Therefore, even if a surface oxide film is formed, the conductive beads can break through (penetrate through) the surface oxide film, thereby suppressing the increase in the contact resistance. The conductive beads 71 may penetrate not only through the surface oxide film but also the upper connecting portions 60 and 19p, which are the transparent conductive layers, thereby being in direct contact with the patch connecting portion 15p and the slot electrode 55.

The transfer portions may be arranged in either one or both of the center portion and the peripheral portion of the scanned antenna 1000 (i.e., on the inner side and the outer side of the donut-shaped transmitting/receiving region R1 as seen from the direction normal to the scanned antenna 1000). The transfer portions may be arranged in the seal region Rs for sealing the liquid crystal and may be arranged on the outer side of the seal region Rs (the opposite side from the liquid crystal layer).

<Method for Manufacturing Slot Substrate 201>

The slot substrate 201 can be manufactured by the following method, for example.

First, a third insulating layer (thickness: 200 nm, for example) 52 is formed on a dielectric substrate. The dielectric substrate may be a substrate having a high transmittance for electromagnetic waves (having a small dielectric constant $\varepsilon_M$ and a small dielectric loss tan $\delta_M$), such as a glass substrate or a resin substrate. The dielectric substrate is preferably thin in order to suppress the attenuation of electromagnetic waves. For example, the glass substrate can be thinned from the reverse side after the formation of elements such as the slot electrode 55 on the surface of the glass substrate in the process to be described later. Thus, the thickness of the glass substrate can be reduced to 500 μm or less, for example.

When a resin substrate is used as the dielectric substrate, elements such as TFTs may be formed directly on the resin substrate or may be formed on the resin substrate using a transfer method. With a transfer method, for example, after a resin film (e.g., a polyimide film) is formed on a glass substrate and elements are formed on the resin film by a process to be described later, the resin film on which the elements have been formed is separated from the glass substrate. Typically, a resin has a smaller dielectric constant $\varepsilon_M$ and a smaller dielectric loss tan $\delta_M$ than a glass. The thickness of the resin substrate is 3 μm to 300 μm, for example. As the resin material, a liquid crystal polymer may be used, for example, as well as a polyimide.

There is no particular limitation on the third insulating layer 52, and it may be a silicon oxide ($SiO_2$) film, a silicon nitride (SiNx) film, a silicon oxide nitride (SiOxNy; x>y) film, a silicon nitride oxide (SiNxOy; x>y) film, or the like, for example.

Then, a metal film is formed on the third insulating layer 52 and patterned, thereby obtaining the slot electrode 55 having a plurality of slots 57. The metal film may be a Cu film (or an Al film) having a thickness of 2 μm to 5 μm. Herein, a layered film including a Ti film, a Cu film and a Ti film layered in this order is used.

Then, a fourth insulating layer (thickness: 100 nm, for example) 58 is formed on the slot electrode 55 and in the slot 57. The material of the fourth insulating layer 58 may be the same as the third insulating layer. Then, in the non-transmitting/receiving region R2, an opening that reaches the slot electrode 55 is formed in the fourth insulating layer 58.

Then, a transparent conductive film is formed on the fourth insulating layer 58 and in the opening of the fourth insulating layer 58 and is patterned, thereby forming the upper connecting portion 60 that is in contact with the slot electrode 55 in the opening. Thus, the terminal portion IT is obtained.

<Material and Structure of TFT 10>

In the present embodiment, a TFT using the semiconductor layer 5 as the active layer is used as a switching element arranged in each pixel. The semiconductor layer 5 is not limited to an amorphous silicon layer, but may be a polysilicon layer or an oxide semiconductor layer.

When an oxide semiconductor layer is used, the oxide semiconductor included in the oxide semiconductor layer may be an amorphous oxide semiconductor or a crystalline oxide semiconductor having a crystalline portion. Examples of the crystalline oxide semiconductor include a polycrystalline oxide semiconductor, a microcrystalline oxide semiconductor, a crystalline oxide semiconductor whose c-axis is oriented generally vertical to the layer surface, etc.

The oxide semiconductor layer may have a layered structure of two or more layers. When the oxide semiconductor layer has a layered structure, the oxide semiconductor layer may include an amorphous oxide semiconductor layer and a crystalline oxide semiconductor layer. Alternatively, it may include a plurality of crystalline oxide semiconductor layers having different crystalline structures. Alternatively, it may include a plurality of amorphous oxide semiconductor layers. When the oxide semiconductor layer has a 2-layer structure including an upper layer and a lower layer, the energy gap of the oxide semiconductor included in the upper layer is preferably greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure and the deposition method of the amorphous oxide semiconductor, those of the crystalline oxide semiconductors described above, and the structure of the oxide semiconductor layer having a layered structure, etc., are described in Japanese Laid-Open Patent Publication No. 2014-007399, for example. The entire disclosure of Japanese Laid-Open Patent Publication No. 2014-007399 is herein incorporated by reference.

The oxide semiconductor layer may include at least one metal element from among In, Ga and Zn, for example. In the present embodiment, the oxide semiconductor layer includes an In—Ga—Zn—O-based semiconductor (e.g., indium gallium zinc oxide), for example. Herein, the In—Ga—Zn—O-based semiconductor is a ternary oxide of In (indium), Ga (gallium) and Zn (zinc), and there is no particular limitation on the ratio (composition ratio) between In, Ga and Zn, e.g., In:Ga:Zn=2:2:1, In:Ga:Zn=1:1:1, In:Ga:Zn=1:1:2, etc. Such an oxide semiconductor layer may be formed of an oxide semiconductor film including an In—Ga—Zn—O-based semiconductor. Note that a channel-etched-type TFT having an active layer including an oxide semiconductor, such as an In—Ga—Zn—O-based semiconductor, may be referred to as a "CE-OS-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally vertical to the layer surface, etc.

Note that the crystalline structure of the crystalline In—Ga—Zn—O-based semiconductor is disclosed for example in Japanese Laid-Open Patent Publication No. 2014-007399, Japanese Laid-Open Patent Publication No. 2012-134475, Japanese Laid-Open Patent Publication No. 2014-209727, etc., mentioned above. The entire disclosures of Japanese Laid-Open Patent Publication No. 2012-134475 and Japanese Laid-Open Patent Publication No. 2014-209727 are herein incorporated by reference. A TFT including an In—Ga—Zn—O-based semiconductor layer, which has a high mobility (greater than 20 times that of an a-Si TFT) and a lower leak current (less than 1/100 that of an a-Si TFT), can suitably be used as a driver TFT (e.g., a TFT included in the driving circuit provided in the non-transmitting/receiving region) and a TFT provided in each antenna element region.

The oxide semiconductor layer may include any other oxide semiconductor instead of an In—Ga—Zn—O-based semiconductor. For example, it may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin) and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, etc.

Figure 3:
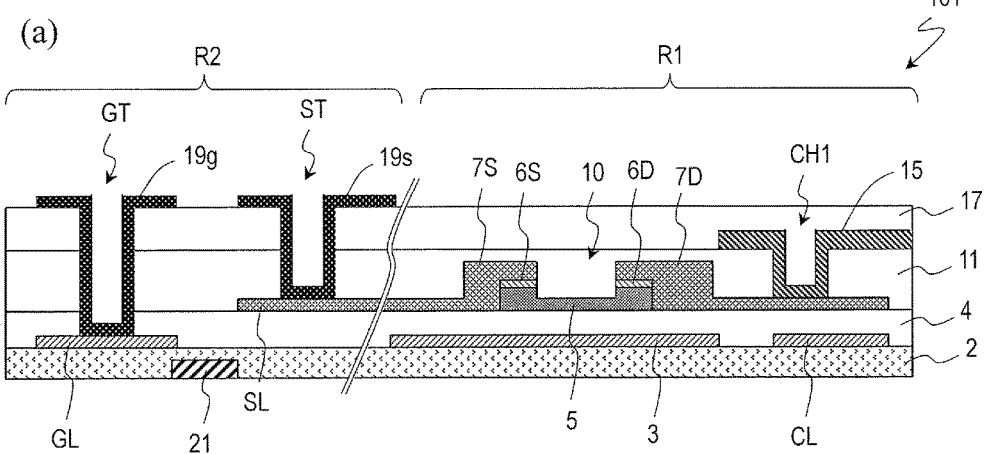
FIG. 3(a) and (b) are a cross-sectional view and a plan view, respectively, schematically showing an antenna element region U of the TFT substrate 101.
Figure 3:
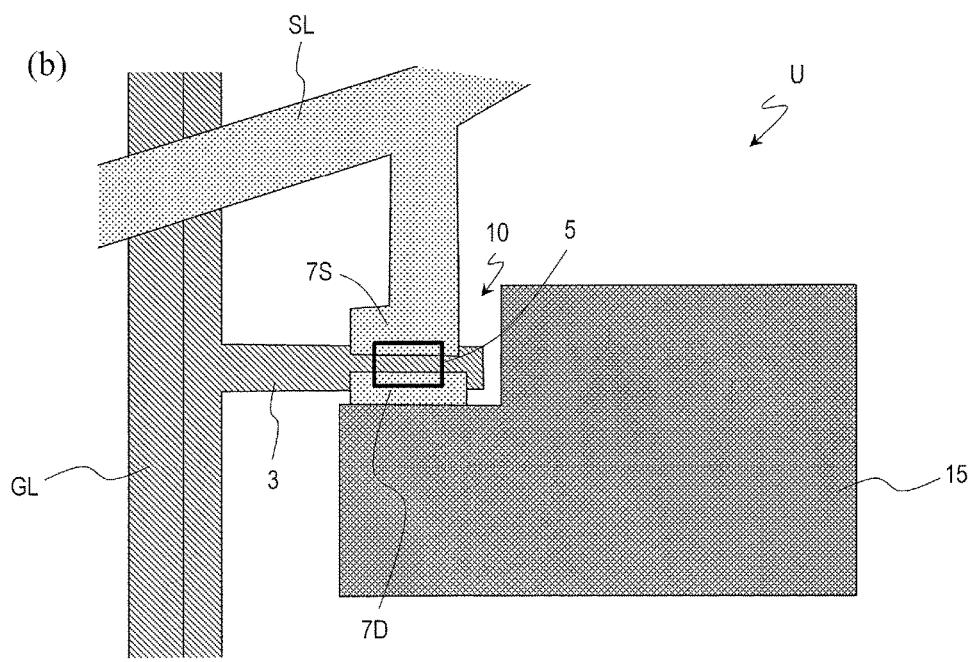

In the example shown in FIG. 3, the TFT 10 is a channel-etched-type TFT having a bottom gate structure. In a "channel-etched-type TFT", there is no etch-stop layer over the channel region, and the lower surfaces of the channel-side end portions of the source and drain electrodes are arranged so as to be in contact with the upper surface of the semiconductor layer. A channel-etched-type TFT is formed for example by forming a source-drain electrode conductive film on a semiconductor layer, and performing a source-drain separation. In the source-drain separation step, the surface portion of the channel region may be etched.

Note that the TFT 10 may be an etch-stop-type TFT in which an etch-stop layer is formed over the channel region. In an etch-stop-type TFT, the lower surfaces of the channel-side end portions of the source and drain electrodes are located over the etch-stop layer, for example. An etch-stop-type TFT is formed for example by forming an etch-stop layer covering a portion of a semiconductor layer that is to be the channel region, then forming a source-drain electrode conductive film over the semiconductor layer and the etch-stop layer, and performing a source-drain separation.

While the TFT 10 has a top contact structure in which the source and drain electrodes are in contact with the upper surface of the semiconductor layer, the source and drain electrodes may be arranged so as to be in contact with the lower surface of the semiconductor layer (bottom contact structure). Moreover, the TFT 10 may have a bottom gate structure in which the gate electrode is provided on the dielectric substrate side of the semiconductor layer, or a top gate structure in which the gate electrode is provided above the semiconductor layer.

Second Embodiment

A scanned antenna according to a second embodiment will be described with reference to the drawings. The TFT substrate of the scanned antenna of the present embodiment is different from the TFT substrate 101 shown in FIG. 2 in that the transparent conductive layer to be the upper connecting portions of the terminal portions is provided between the first insulating layer and the second insulating layer of the TFT substrate.

Figure 4:
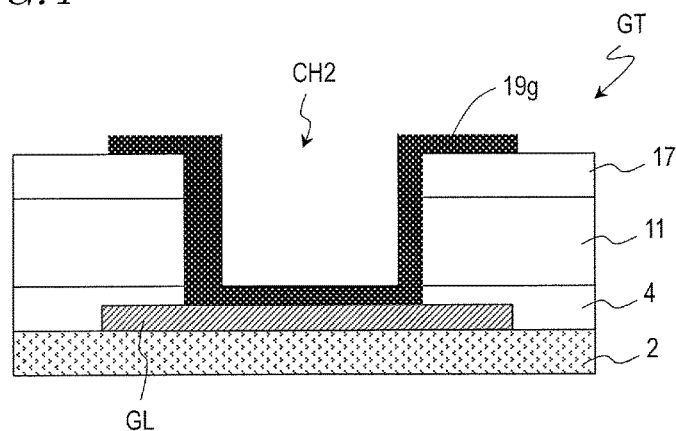
FIG. 4(a) to (c) are cross-sectional views schematically showing a gate terminal portion GT, a source terminal portion ST and a transfer terminal portion PT, respectively, of the TFT substrate 101.
Figure 4:
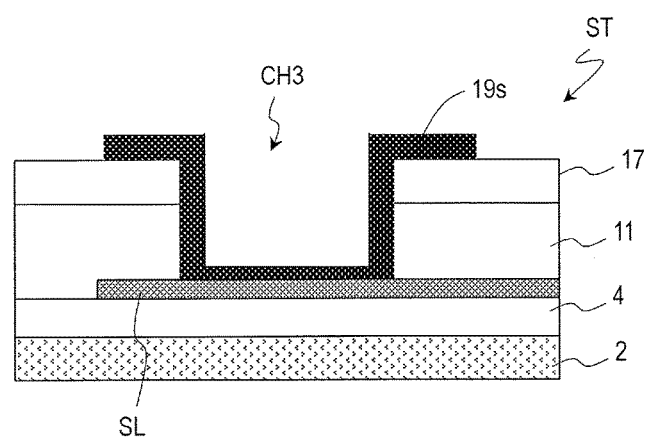
Figure 4:
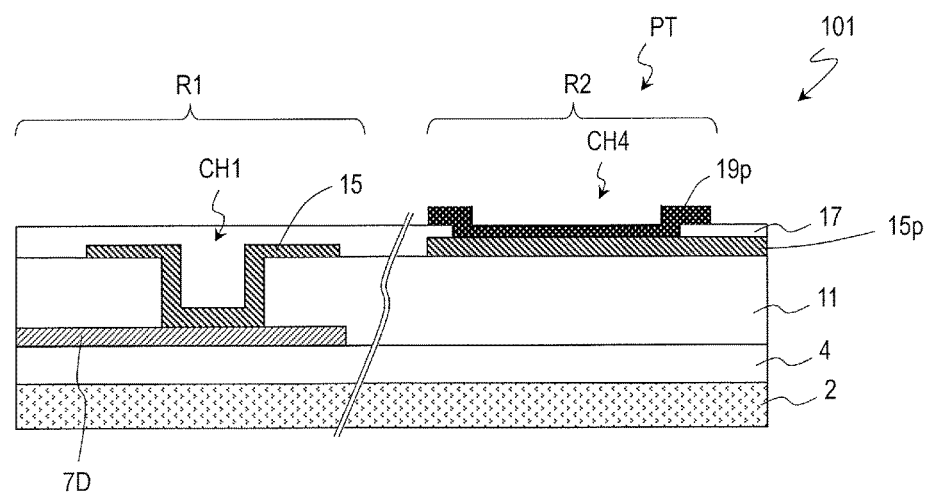

FIG. 8(a) to (c) are cross-sectional views showing the gate terminal portion GT, the source terminal portion ST and the transfer terminal portion PT, respectively, of the TFT substrate 102 of the present embodiment. Like elements to those of FIG. 4 are denoted by like reference signs and will not be discussed below. Note that the cross-sectional structure of the antenna element region U will not be shown in the figures or discussed below as it is similar to that of the embodiment described above (FIG. 3).

The gate terminal portion GT of the present embodiment includes the gate bus line GL formed on the dielectric substrate, an insulating layer covering the gate bus line GL, and the gate terminal upper connecting portion 19g. The gate terminal upper connecting portion 19g is in contact with the gate bus line GL in the contact hole CH2 formed in the insulating layer. In this example, the insulating layer covering the gate bus line GL includes the gate insulating layer 4 and the first insulating layer 11. The second insulating layer 17 is formed on the gate terminal upper connecting portion 19g and the first insulating layer 11. The second insulating layer 17 includes an opening 18g which exposes a portion of the gate terminal upper connecting portion 19g. In this example, the opening 18g of the second insulating layer 17 may be arranged so that the entire contact hole CH2 is exposed.

The source terminal portion ST includes the source bus line SL formed on the dielectric substrate (herein, on the gate insulating layer 4), an insulating layer covering the source bus line SL, and the source terminal upper connecting portion 19s. The source terminal upper connecting portion 19s is in contact with the source bus line SL in the contact hole CH3 formed in the insulating layer. In this example, the insulating layer covering the source bus line SL only includes the first insulating layer 11. The second insulating layer 17 extends over the source terminal upper connecting portion 19s and the first insulating layer 11. The second insulating layer 17 includes an opening 18s which exposes a portion of the source terminal upper connecting portion 19s. The opening 18s of the second insulating layer 17 may be arranged so that the entire contact hole CH3 is exposed.

The transfer terminal portion PT includes a source connection line 7p formed of the same conductive film (source conductive film) as the source bus line SL, the first insulating layer 11 extending over the source connection line 7p, and the transfer terminal upper connecting portion 19p and the patch connecting portion 15p provided on the first insulating layer 11.

Contact holes CH5 and CH6 exposing the source connection line 7p are provided in the first insulating layer 11. The transfer terminal upper connecting portion 19p is arranged on the first insulating layer 11 and in the contact hole CH5, and is in contact with the source connection line 7p in the contact hole CH5. The patch connecting portion 15p is arranged on the first insulating layer 11 and in the contact hole CH6, and is in contact with the source connection line 7p in the contact hole CH6. The transfer terminal upper connecting portion 19p is a transparent electrode formed of a transparent conductive film. The patch connecting portion 15p is formed of the same conductive film as the patch electrode 15. Note that the upper connecting portions 19g, 19s and 19p of the terminal portions may be formed of the same transparent conductive film.

The second insulating layer 17 extends over the transfer terminal upper connecting portion 19p, the patch connecting portion 15p and the first insulating layer 11. The second insulating layer 17 includes an opening 18p which exposes a portion of the transfer terminal upper connecting portion 19p. In this example, the opening 18p of the second insulating layer 17 is arranged so that the entire contact hole CH5 is exposed. On the other hand, the patch connecting portion 15p is covered by the second insulating layer 17.

Thus, in the present embodiment, the source connection line 7p formed in the source metal layer electrically connects together the transfer terminal upper connecting portion 19p and the patch connecting portion 15p of the transfer terminal portion PT. Although not shown in the figure, the transfer terminal upper connecting portion 19p is connected to the slot electrode on the slot substrate 201 via a seal resin containing conductive particles therein, as in the embodiment described above.

In the embodiment described above, the contact holes CH1 to CH4 having different depths are formed in a single step after the formation of the second insulating layer 17. For example, a relatively thick insulating layer (the gate insulating layer 4, the first insulating layer 11 and the second insulating layer 17) is etched in the gate terminal portion GT, whereas only the second insulating layer 17 is etched in the transfer terminal portion PT. Therefore, a conductive film (e.g., a patch electrode conductive film) to be the base for the shallow contact hole may possibly be damaged significantly during the etching.

In contrast, in the present embodiment, the contact holes CH1 to CH3, CH5 and CH6 are formed before the second insulating layer 17 is formed. Since these contact holes are formed only in the first insulating layer 11 or in the layered film of the first insulating layer 11 and the gate insulating layer 4, it is possible to reduce the difference in depth between contact holes formed in a single step as compared with the embodiment described above. Therefore, it is possible to reduce the damage on the conductive film to be the base for the contact holes. Particularly, when an Al film is used for the patch electrode conductive film, a desirable contact cannot be realized if the ITO film and the Al film are allowed to be in direct contact with each other. Therefore, a cap layer such as an MoN layer may be formed on the Al film. Then, advantageously, there is no longer a need to increase the thickness of the cap layer in view of the damage from the etching.

<Method for Manufacturing TFT Substrate 102>

Figure 9:
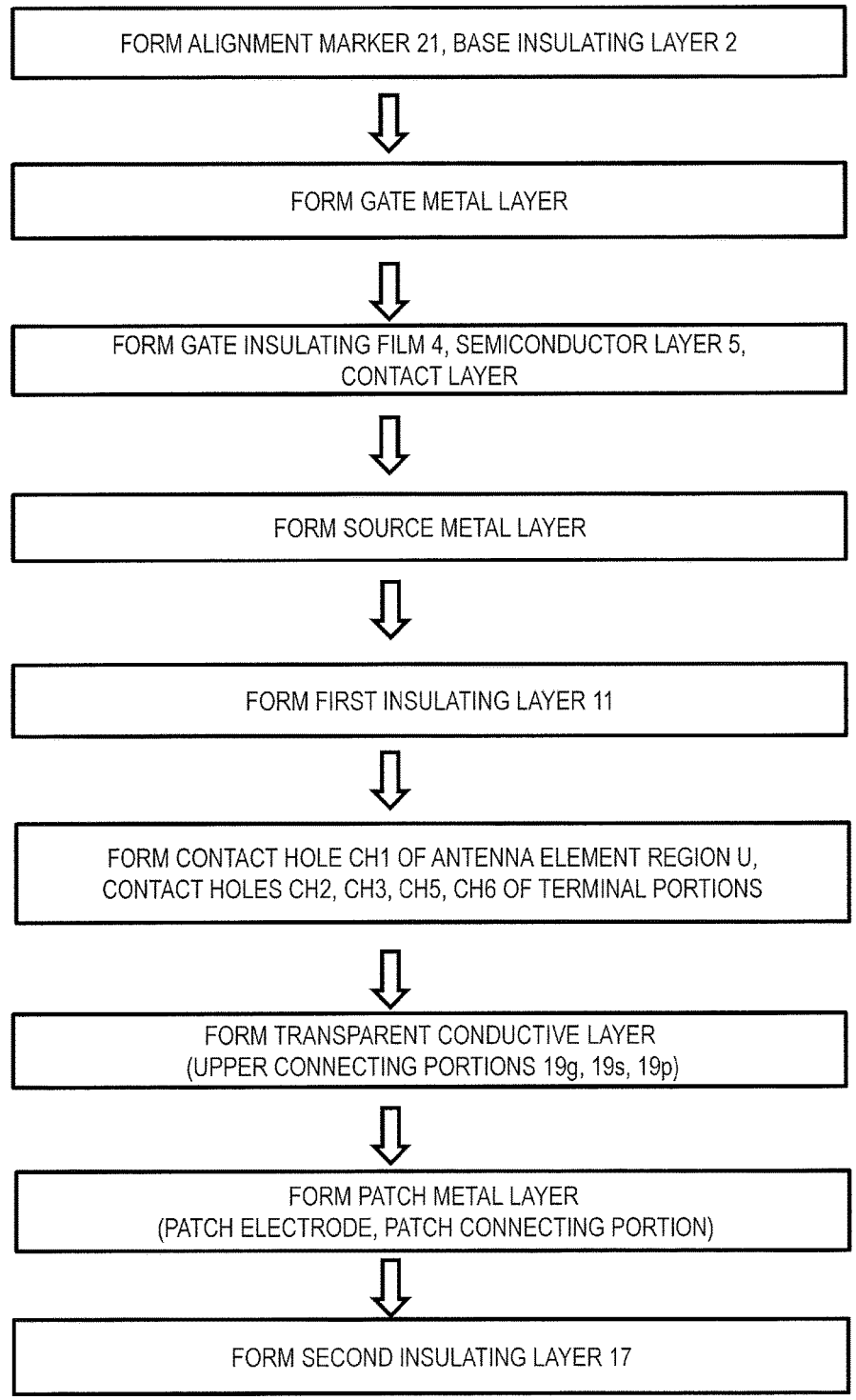
FIG. 9A diagram showing example steps of manufacturing the TFT substrate 102.

The TFT substrate 102 is manufactured by the following method, for example. FIG. 9 is a diagram illustrating steps for manufacturing the TFT substrate 102. Note that the materials, the thicknesses, the methods of formation, etc., of the various layers will not be discussed below if they are similar to those of the TFT substrate 101 described above.

First, an alignment mark, a base insulating layer, a gate metal layer, a gate insulating layer, a semiconductor layer, a contact layer and a source metal layer are formed on a dielectric substrate by a method similar to the TFT substrate 102, thereby obtaining TFTs. In the step of forming the source metal layer, the source connection line 7p, as well as the source and drain electrodes and the source bus line, is formed of the source conductive film.

Then, the first insulating layer 11 is formed so as to cover the source metal layer. Then, the first insulating layer 11 and the gate insulating layer 4 are etched in a single step, thereby forming the contact holes CH1 to CH3, CH5 and CH6. In the etching, the source bus line SL and the gate bus line GL function as etch stops. Therefore, in the transmitting/receiving region R1, the contact hole CH1, which reaches the drain electrode of the TFT, is formed in the first insulating layer 11. In the non-transmitting/receiving region R2, the contact hole CH2 reaching the gate bus line GL is formed in the first insulating layer 11 and the gate insulating layer 4, the contact hole CH3 reaching the source bus line SL and the contact holes CH5 and CH6 reaching the source connection line 7p are formed in the first insulating layer 11. The contact hole CH5 may be arranged in the seal region Rs, and the contact hole CH6 on the outer side of the seal region Rs. Alternatively, they may both be arranged on the outer side of the seal region Rs.

Then, a transparent conductive film is formed on the first insulating layer 11 and in the contact holes CH1 to CH3, CH5 and CH6, and is patterned. Thus, the gate terminal upper connecting portion 19g in contact with the gate bus line GL in the contact hole CH2, the source terminal upper connecting portion 19s in contact with the source bus line SL in the contact hole CH3, and the transfer terminal upper connecting portion 19p in contact with the source connection line 7p in the contact hole CH5 are formed.

Then, a patch electrode conductive film is formed on the first insulating layer 11, the gate terminal upper connecting portion 19g, the source terminal upper connecting portion 19s and the transfer terminal upper connecting portion 19p, and in the contact holes CH1 and CH6, and is patterned. Thus, the patch electrode 15 in contact with the drain electrode 7D in the contact hole CH1 is formed in the transmitting/receiving region R1, and the patch connecting portion 15p in contact with the source connection line 7p in the contact hole CH6 is formed in the non-transmitting/receiving region R2. The patterning of the patch electrode conductive film may be performed by wet etching. Herein, an etchant is used, with which it is possible to realize a high etching selectivity between the transparent conductive film (e.g., ITO) and the patch electrode conductive film (e.g., an Al film). Thus, the transparent conductive film can function as an etch stop while patterning the patch electrode conductive film. Portions of the source bus line SL, the gate bus line GL and the source connection line 7p that are exposed through the contact holes CH2, CH3 and CH5 are not etched as they are covered by the etch stop (transparent conductive film).

Then, the second insulating layer 17 is formed. Then, the second insulating layer 17 is patterned through dry etching using a fluorine-based gas, for example. Thus, the opening 18g which exposes the gate terminal upper connecting portion 19g, the opening 18s which exposes the source terminal upper connecting portion 19s, and the opening 18p which exposes the transfer terminal upper connecting portion 19p are provided in the second insulating layer 17. Thus, the TFT substrate 102 is obtained.

Third Embodiment

A scanned antenna according to a third embodiment will be described with reference to the drawings. The TFT substrate of the scanned antenna of the present embodiment is different from the TFT substrate 102 shown in FIG. 8 in that the upper connecting portion formed of a transparent conductive film is absent in the transfer terminal portion.

Figure 8:
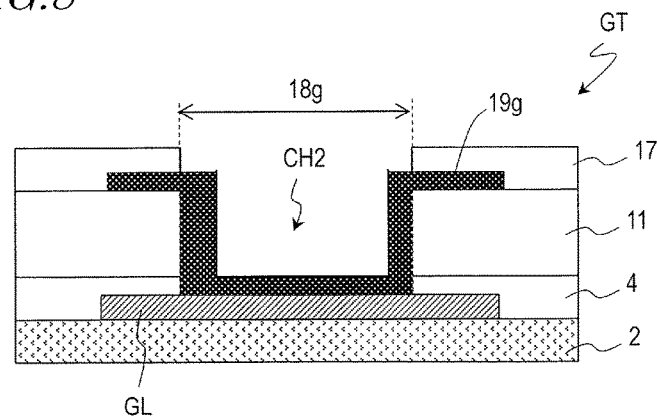
FIG. 8(a) to (c) are cross-sectional views showing the gate terminal portion GT, the source terminal portion ST and the transfer terminal portion PT, respectively, of a TFT substrate 102 according to a second embodiment.
Figure 8:
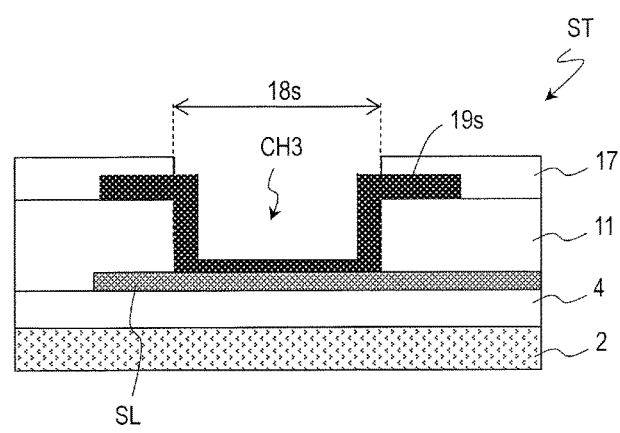
Figure 8:
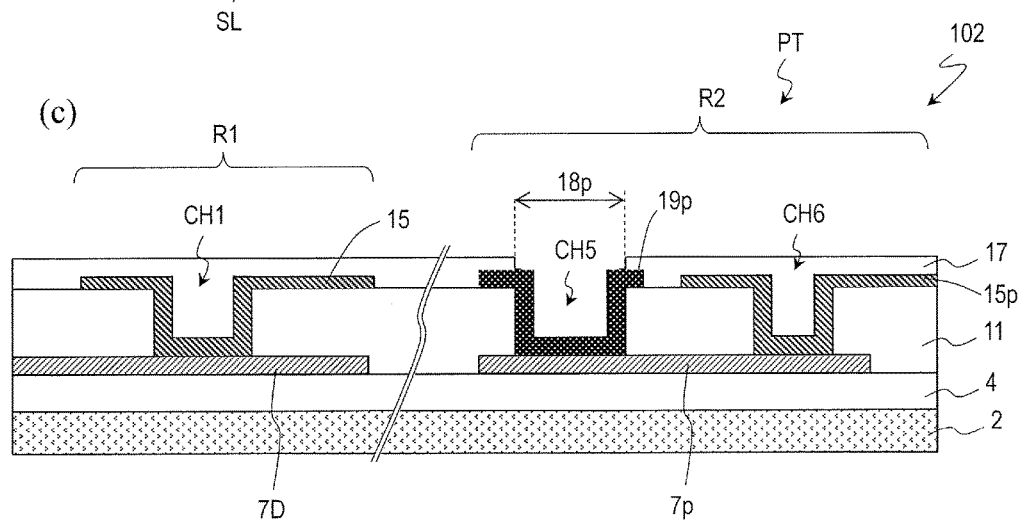
Figure 10:
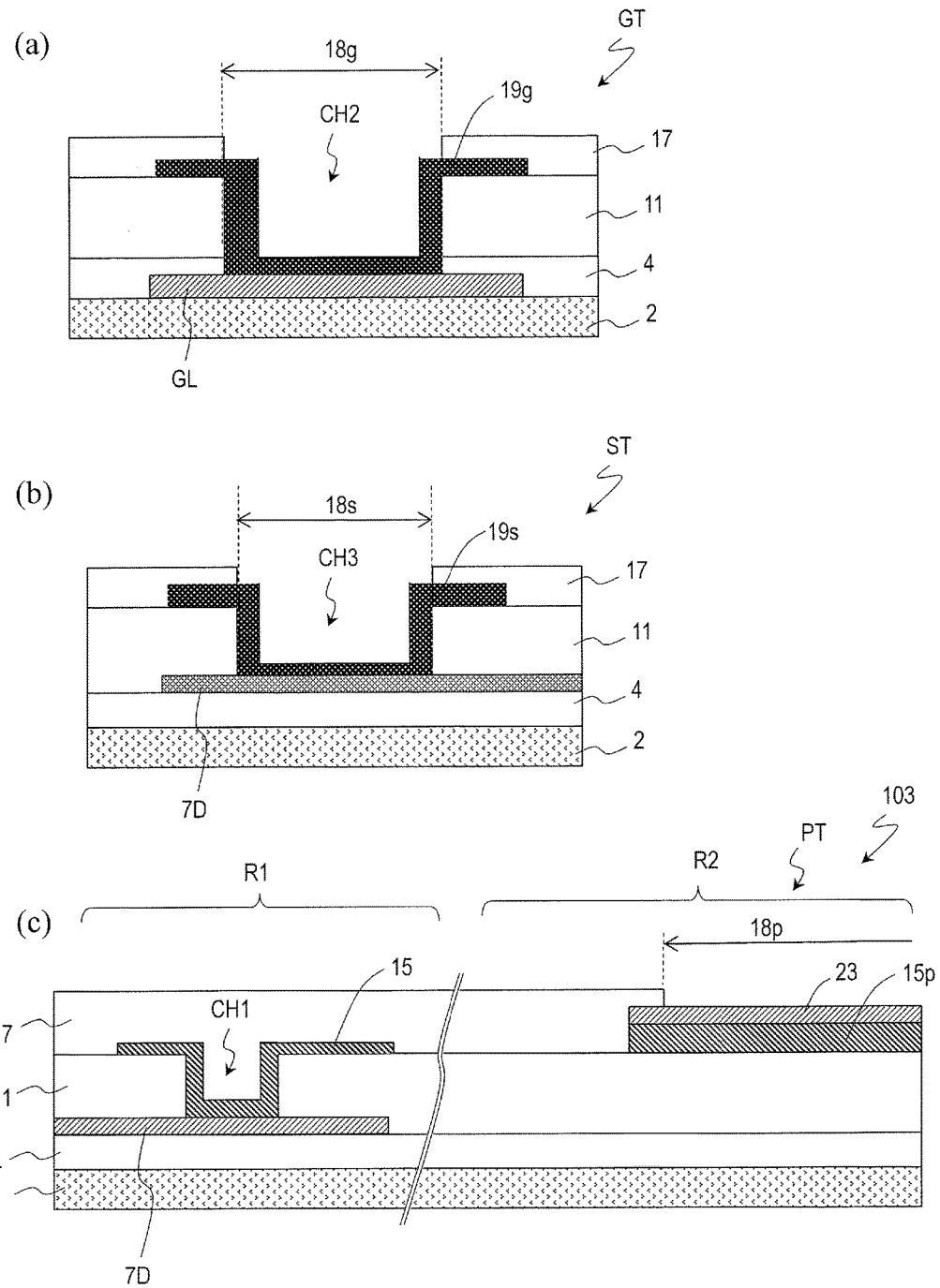
FIG. 10(a) to (c) are cross-sectional views showing the gate terminal portion GT, the source terminal portion ST and the transfer terminal portion PT, respectively, of a TFT substrate 103 according to a third embodiment.

FIG. 10(a) to (c) are cross-sectional views showing the gate terminal portion GT, the source terminal portion ST and the transfer terminal portion PT, respectively, of the TFT substrate 103 of the present embodiment. Like elements to those of FIG. 8 are denoted by like reference signs and will not be discussed below. Note that the structure of the antenna element region U will not be shown in the figures or discussed below as it is similar to that of the embodiment described above (FIG. 3).

The structure of the gate terminal portion GT and the source terminal portion ST is similar to the structure of the gate terminal portion and the source terminal portion of the TFT substrate 102 shown in FIG. 8.

The transfer terminal portion PT includes the patch connecting portion 15p formed on the first insulating layer 11, and a protection conductive layer 23 stacked on the patch connecting portion 15p. The second insulating layer 17 extends over the protection conductive layer 23, and has the opening 18p which exposes a portion of the protection conductive layer 23. On the other hand, the patch electrode 15 is covered by the second insulating layer 17.

<Method for Manufacturing TFT Substrate 103>

Figure 11:
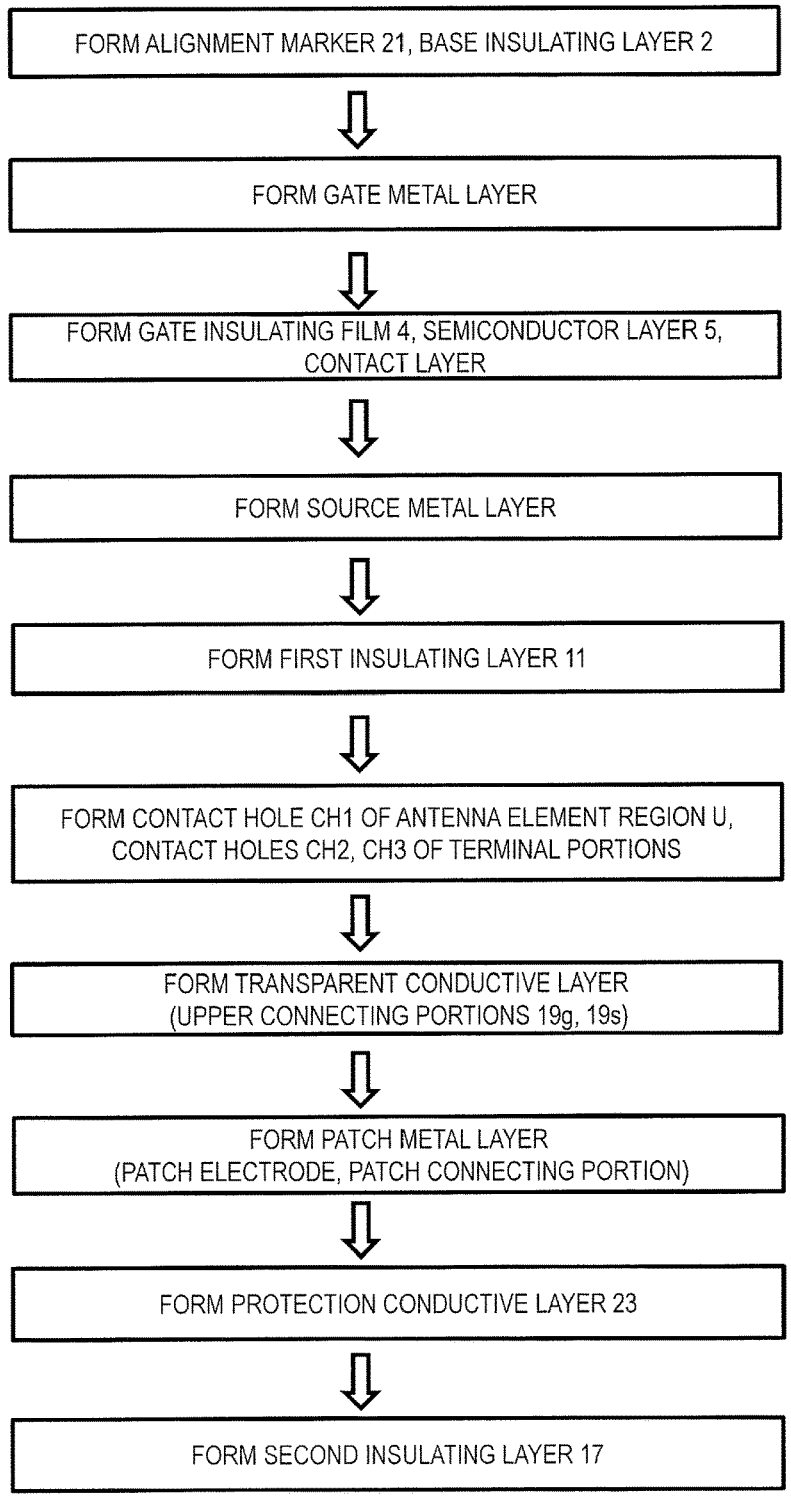
FIG. 11A diagram showing example steps of manufacturing the TFT substrate 103.

The TFT substrate 103 is manufactured by the following method, for example. FIG. 11 is a diagram illustrating steps for manufacturing the TFT substrate 103. Note that the materials, the thicknesses, the methods of formation, etc., of the various layers will not be discussed below if they are similar to those of the TFT substrate 101 described above.

First, an alignment mark, a base insulating layer, a gate metal layer, a gate insulating layer, a semiconductor layer, a contact layer and a source metal layer are formed on a dielectric substrate by a method similar to the TFT substrate 101, thereby obtaining TFTs.

Then, the first insulating layer 11 is formed so as to cover the source metal layer. Then, the first insulating layer 11 and the gate insulating layer 4 are etched in a single step, thereby forming the contact holes CH1 to CH3. In the etching, the source bus line SL and the gate bus line GL function as etch stops. Therefore, the contact hole CH1, which reaches the drain electrode of the TFT, is formed in the first insulating layer 11, the contact hole CH2, which reaches the gate bus line GL, is formed in the first insulating layer 11 and the gate insulating layer 4, and the contact hole CH3, which reaches the source bus line SL, is formed in the first insulating layer 11. No contact hole is formed in the region where the transfer terminal portion is formed.

Then, a transparent conductive film is formed on the first insulating layer 11 and in the contact holes CH1, CH2 and CH3, and is patterned. Thus, the gate terminal upper connecting portion 19g in contact with the gate bus line GL in the contact hole CH2, and the source terminal upper connecting portion 19s in contact with the source bus line SL in the contact hole CH3 are formed. The transparent conductive film is removed from the region where the transfer terminal portion is formed.

Then, a patch electrode conductive film is formed on the first insulating layer 11, the gate terminal upper connecting portion 19g and the source terminal upper connecting portion 19s, and in the contact hole CH1, and is patterned. Thus, the patch electrode 15 in contact with the drain electrode 7D in the contact hole CH1 is formed in the transmitting/receiving region R1, and the patch connecting portion 15p is formed in the non-transmitting/receiving region R2. As in the embodiment described above, an etchant with which it is possible to ensure an etching selectivity between the transparent conductive film (e.g., ITO) and the patch electrode conductive film is used for the patterning of the patch electrode conductive film.

Then, the protection conductive layer 23 is formed on the patch connecting portion 15p. The protection conductive layer 23 may be a Ti layer, an ITO layer, an IZO (indium zinc oxide) layer, or the like (thickness: 50 nm or more and 100 nm or less, for example). Herein, a Ti layer (thickness: 50 nm, for example) is used as the protection conductive layer 23. Note that the protection conductive layer may be formed on the patch electrode 15.

Then, the second insulating layer 17 is formed. Then, the second insulating layer 17 is patterned through dry etching using a fluorine-based gas, for example. Thus, the opening 18g which exposes the gate terminal upper connecting portion 19g, the opening 18s which exposes the source terminal upper connecting portion 19s, and the opening 18p which exposes the protection conductive layer 23 are provided in the second insulating layer 17. Thus, the TFT substrate 103 is obtained.

<Structure of Slot Substrate 203>

Figure 12:
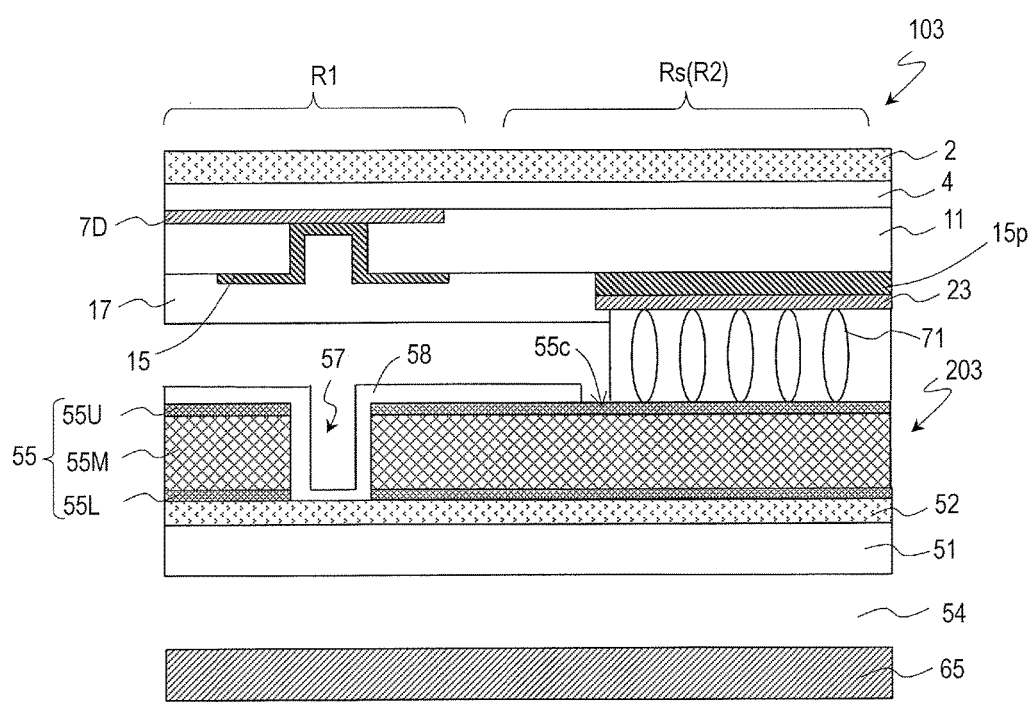
FIG. 12A schematic cross-sectional view illustrating a transfer portion of the TFT substrate 103 and a slot substrate 203.

FIG. 12 is a schematic cross-sectional view illustrating a transfer portion that connects together the transfer terminal portion PT of the TFT substrate 103 and the terminal portion IT of the slot substrate 203 according to the present embodiment. In FIG. 12, like elements to those of the embodiment described above are denoted by like reference signs.

First, the slot substrate 203 of the present embodiment will be described. The slot substrate 203 includes the dielectric substrate 51, the third insulating layer 52 formed on the front surface of the dielectric substrate 51, the slot electrode 55 formed on the third insulating layer 52, and the fourth insulating layer 58 covering the slot electrode 55. The reflective conductive plate 65 is arranged so as to oppose the reverse surface of the dielectric substrate 51 with the dielectric layer (air layer) 54 interposed therebetween. The slot electrode 55 and the reflective conductive plate 65 each function as a wall of the waveguide 301.

The slot electrode 55 has a layered structure including a Cu layer or an Al layer as the main layer 55M. In the transmitting/receiving region R1, a plurality of slots 57 are formed in the slot electrode 55. The structure of the slot electrode 55 in the transmitting/receiving region R1 is the same as the structure of the slot substrate 201 described above with reference to FIG. 6.

The terminal portion IT is provided in the non-transmitting/receiving region R2. In the terminal portion IT, an opening is provided in the fourth insulating layer 58, through which the surface of the slot electrode 55 is exposed. The region where the slot electrode 55 is exposed is a contact surface 55c. As described above, in the present embodiment, the contact surface 55c of the slot electrode 55 is not covered by the fourth insulating layer 58.

In the transfer portion, the protection conductive layer 23 covering the patch connecting portion 15p in the TFT substrate 103 and the contact surface 55c of the slot electrode 55 in the slot substrate 203 are connected together via a resin (seal resin) containing the conductive beads 71 therein.

As in the embodiment described above, the transfer portions of the present embodiment may be arranged in both of the center portion and the peripheral portion of the scanned antenna or may be arranged in only one of the center portion and the peripheral portion. They may be arranged in the seal region Rs, or may be arranged on the outer side of the seal region Rs (the opposite side from the liquid crystal layer).

In the present embodiment, the transparent conductive film is not provided on the contact surface of the transfer terminal portion PT and the terminal portion IT. Therefore, the protection conductive layer 23 and the slot electrode 55 of the slot substrate 203 can be connected together via a seal resin containing conductive particles therein.

In the present embodiment, the difference in depth between contact holes formed in a single step is smaller than that of the first embodiment (FIG. 3 and FIG. 4), and it is possible to reduce the damage on the conductive film to be the base for the contact holes.

<Method for Manufacturing Slot Substrate 203>

The slot substrate 203 is manufactured as follows. The materials, the thicknesses and the methods of formation of the various layers will not be discussed below as they are similar to those of the slot substrate 201.

First, by a method similar to that of the slot substrate 201, the third insulating layer 52 and the slot electrode 55 are formed on the dielectric substrate, and a plurality of slots 57 are formed in the slot electrode 55. Then, the fourth insulating layer 58 is formed on the slot electrode 55 and in the slots. Then, the opening 18p is provided in the fourth insulating layer 58 so that the region of the slot electrode 55 to be the contact surface is exposed. Thus, the slot substrate 203 is manufactured.

<Internal Heater Structure>

As described above, it is preferred that the liquid crystal material used for antenna elements of an antenna has a high dielectric anisotropy $\Delta\varepsilon_M$. However, a liquid crystal material (nematic liquid crystal) having a high dielectric anisotropy $\Delta\varepsilon_M$ has a high viscosity and thus a slow response speed. Particularly, the viscosity increases when the temperature lowers. The environment temperature of a scanned antenna mounted on a vehicle (e.g., a ship, an aircraft, an automobile) fluctuates. Therefore, it is preferred that the temperature of the liquid crystal material can be controlled to be at a certain level or more, e.g., 30° C. or more, or 45° C. or more. The temperature setting is preferably such that the viscosity of the nematic liquid crystal material is generally 10 cP (centipoise) or less.

A scanned antenna according to an embodiment of the present invention preferably includes an internal heater structure, in addition to the structure described above. The internal heater is preferably a heater based on a resistive heating method utilizing Joule heat. There is no particular limitation on the material of the resistive film for the heater, but it may be a conductive material having a relatively high specific resistance such as ITO or IZO, for example. The resistive film may be formed by using fine lines or a mesh for adjusting the resistance value. The resistance value may be set depending on the desired amount of heat generation.

For example, in order to achieve a resistive film heat generation temperature of 30° C. with 100 V AC (60 Hz) for the area (about 90,000 mm²) of a circle whose diameter is 340 mm, the resistance value of the resistive film may be set to 139Ω, the current to 0.7 A and the power density to 800 W/m². In order to achieve a resistive film heat generation temperature of 45° C. with 100 V AC (60 Hz) for the same area, the resistance value of the resistive film may be set to 82Ω, the current to 1.2 A and the power density to 1350 W/m².

Figure 13:
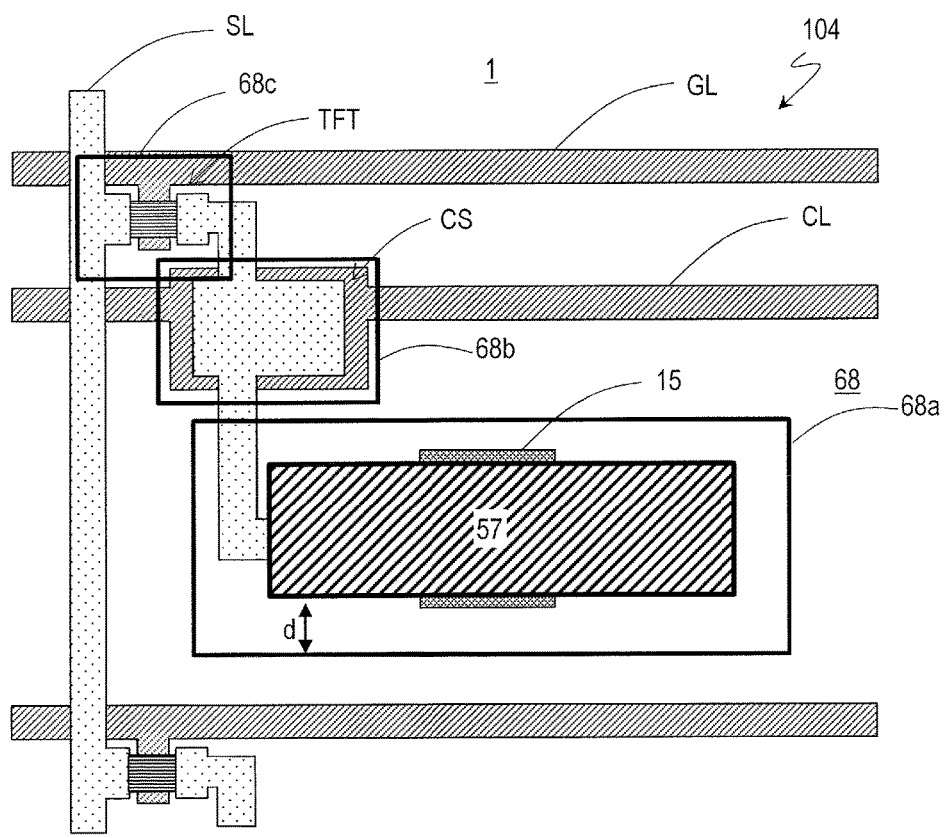
FIG. 13(a) is a schematic plan view of a TFT substrate 104 having a heater resistive film 68, and (b) is a schematic plan view illustrating the size of a slot 57 and a patch electrode 15.
Figure 13:
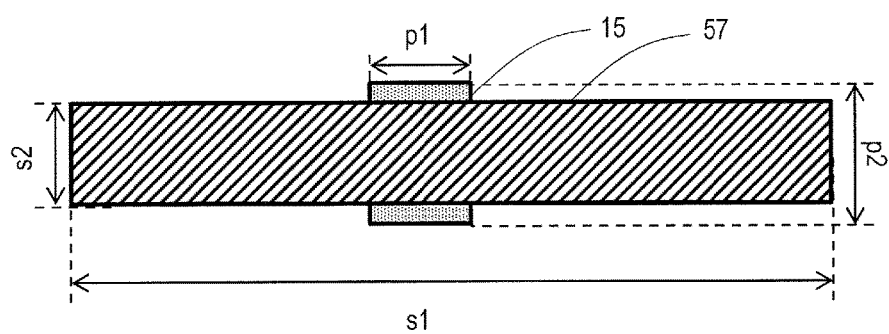

The heater resistive film may be provided anywhere as long as the operation of the scanned antenna is not affected, but it is preferably provided near the liquid crystal layer in order to effectively heat the liquid crystal material. For example, as shown in the TFT substrate 104 shown in FIG. 13(a), a resistive film 68 may be formed generally across the entire surface of the dielectric substrate 1. FIG. 13(a) is a schematic plan view of the TFT substrate 104 including the heater resistive film 68. The resistive film 68 is covered by the base insulating layer 2 shown in FIG. 3, for example. The base insulating layer 2 is formed so as to have a sufficient dielectric strength voltage.

The resistive film 68 preferably has openings 68a, 68b and 68c. The slot 57 is located so as to oppose the patch electrode 15 when the TFT substrate 104 and the slot substrate are attached together. The opening 68a is arranged so that the resistive film 68 is absent along the periphery of the slot 57 within a distance d from the edge of the slot 57. For example, d is 0.5 mm. It is preferred that the opening 68b is arranged under the storage capacitor CS, and the opening 68c is arranged under the TFT.

Note that the size of the antenna element U is 4 mm×4 mm, for example. As shown in FIG. 13(b), for example, the width s2 of the slot 57 is 0.5 mm, the length s1 of the slot 57 is 3.3 mm, the width p2 of the patch electrode 15 in the width direction of the slot 57 is 0.7 mm, and the width p1 of the patch electrode 15 in the longitudinal direction of the slot is 0.5 mm. Note that the size, the shape, the positional relationship, etc., of the antenna element U, the slot 57 and the patch electrode 15 are not limited to those of the example shown in FIGS. 13(a) and 13(b).

A shield conductive layer may be formed so as to further reduce the influence from the electric field from the heater resistive film 68. The shield conductive layer is formed on the base insulating layer 2 generally across the entire surface of the dielectric substrate 1, for example. While the shield conductive layer does not need to be provided with the openings 68a and 68b, as does the resistive film 68, but is preferably provided with the opening 68c. The shield conductive layer is formed of an aluminum layer, for example, and is set to the ground potential.

The resistance value of the resistive film preferably has a distribution such that the liquid crystal layer can be heated uniformly. The temperature distribution of the liquid crystal layer is preferably such that the highest temperature lowest temperature (temperature fluctuation) is 15° C. or less, for example. If the temperature fluctuation is greater than 15° C., the phase difference modulation has in-plane variations, thereby resulting in a problem that desirable beam formation is no longer possible. It is undesirable if the temperature of the liquid crystal layer is close to the Tni point (e.g., 125° C.), in which case $\Delta\varepsilon_M$ is small.

Referring to FIGS. 14(a) and 14(b) and FIGS. 15(a) to 15(c), the distribution of the resistance value of the resistive film will be described. FIGS. 14(a) and 14(b) and FIGS. 15(a) to 15(c) show schematic structures and current distributions of resistive heating structures 80a to 80e. A resistive heating structure includes a resistive film and a heater terminal.

Figure 14:
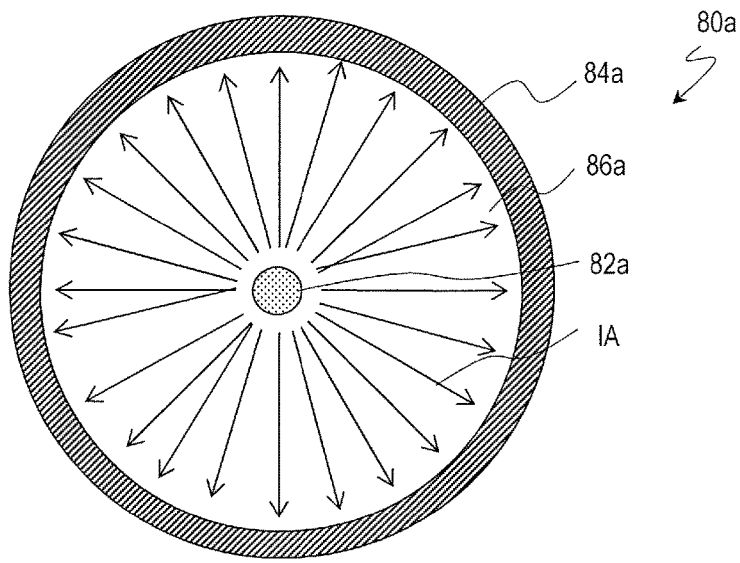
FIG. 14(a) and (b) are diagrams showing the schematic structure and the current distribution of resistive heating structures 80a and 80b, respectively.
Figure 14:
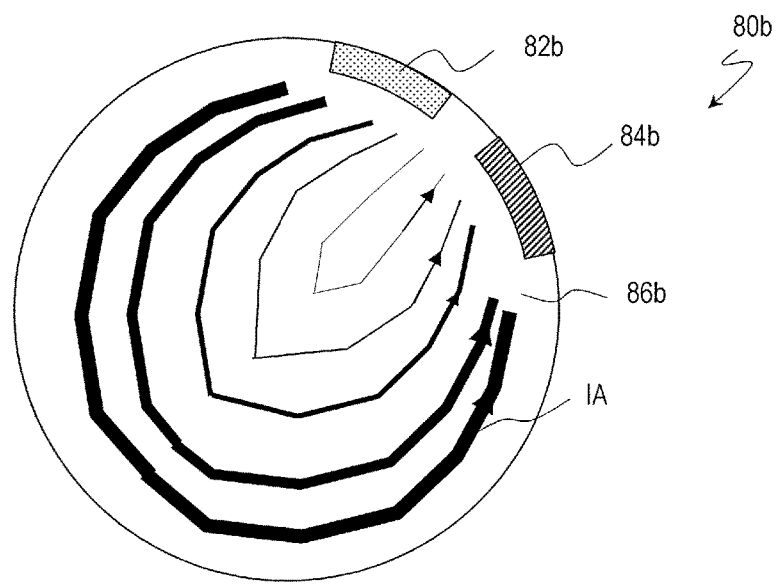

The resistive heating structure 80a shown in FIG. 14(a) includes a first terminal 82a, a second terminal 84a, and a resistive film 86a connected to these terminals. The first terminal 82a is arranged at the center of the circle, and the second terminal 84a is arranged so as to extend along the entire circumference. The circle corresponds to the transmitting/receiving region R1. When a direct current voltage is supplied between the first terminal 82a and the second terminal 84a, a current IA flows in a radial pattern from the first terminal 82a to the second terminal 84a, for example. Therefore, even if the resistive film 86a has a uniform resistance value across the surface thereof, it is possible to uniformly generate heat. It is understood that the direction of the current flow may be from the second terminal 84a toward the first terminal 82a.

The resistive heating structure 80b shown in FIG. 14(b) includes a first terminal 82b, a second terminal 84b, and a resistive film 86b connected to these terminals. The first terminal 82b and the second terminal 84b are arranged adjacent to each other along the circumference. The resistance value of the resistive film 86b has an in-plane distribution so as to achieve a uniform amount of heat per unit area to be generated by the current IA flowing between the first terminal 82b and the second terminal 84b on the resistive film 86b. When the resistive film 86 is formed with fine lines, for example, the in-plane distribution of the resistance value of the resistive film 86b may be adjusted based on the thickness and the density of the fine lines.

Figure 15:
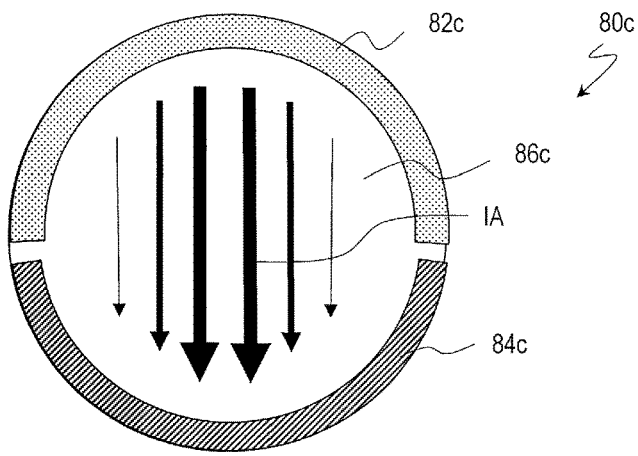
FIG. 15(a) to (c) are diagrams showing the schematic structure and the current distribution of resistive heating structures 80c to 80e, respectively.
Figure 15:
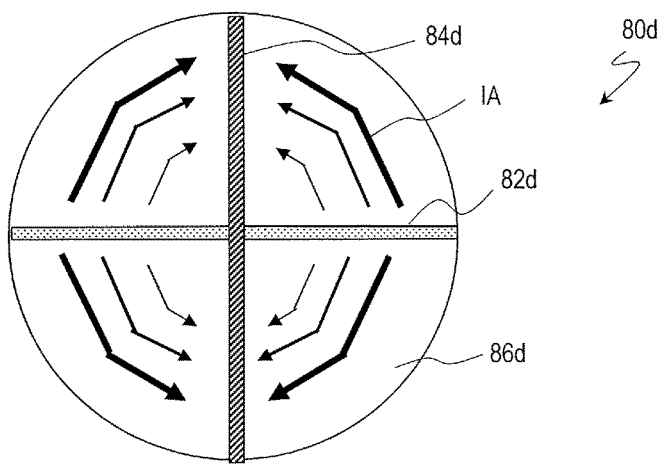
Figure 15:
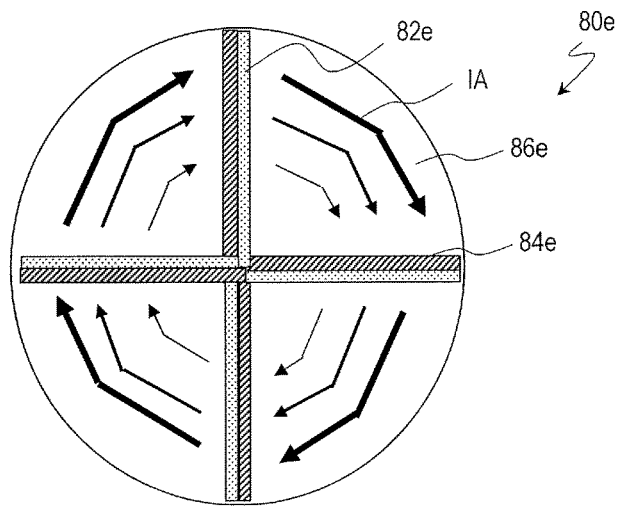

The resistive heating structure 80c shown in FIG. 15(a) includes a first terminal 82c, a second terminal 84c, and a resistive film 86c connected to these terminals. The first terminal 82c is arranged so as to extend along the upper-half circumference of the circle, and the second terminal 84c is arranged so as to extend along the lower-half circumference of the circle. When the resistive film 86c is formed with fine lines extending up and down between the first terminal 82c and the second terminal 84c, for example, adjustments are made such that the thickness and the density of the fine lines are greater around the center, for example, so that the amount of heat per unit area to be generated by the current IA will be uniform across the surface.

The resistive heating structure 80d shown in FIG. 15(b) includes a first terminal 82d, a second terminal 84d, and a resistive film 86d connected to these terminals. The first terminal 82d and the second terminal 84d are provided so as to extend in the up-down direction and the left-right direction, respectively, along diameters of the circle. Although it is simplified in the figure, the first terminal 82d and the second terminal 84d are insulated from each other.

The resistive heating structure 80e shown in FIG. 15(c) includes a first terminal 82e, a second terminal 84e, and a resistive film 86e connected to these terminals. Unlike the resistive heating structure 80d, the resistive heating structure 80e includes the first terminal 82e and the second terminal 84e each including four portions extending in four (up, down, left and right) directions from the center of the circle. A portion of the first terminal 82e and a portion of the second terminal 84e that are at 90 degrees with respect to each other are arranged so that the current IA flows clockwise.

With either the resistive heating structure 80d or the resistive heating structure 80e, adjustments are made such that the thickness and the density of the fine lines are greater on the side closer to the circumference, for example, so that a higher current IA flows at positions closer to the circumference so as to achieve a uniform amount of heat generation per unit area across the surface.

Such an internal heater structure may be activated automatically when the detected temperature of the scanned antenna is below a predetermined temperature. It is understood that it may be activated in response to an operation by the user.

<Driving Method>

An array of antenna elements of a scanned antenna according to an embodiment of the present invention has a structure similar to that of an LCD panel, and it is driven by line-sequential driving, as is an LCD panel. However, the following problems may occur if conventional LCD panel driving methods are applied. Problems that may occur to the scanned antenna will be described below with reference to the equivalent circuit diagram of one antenna element of the scanned antenna shown in FIG. 16.

First, since a liquid crystal material having a high dielectric anisotropy $\Delta\varepsilon_M$ for the microwave region (birefringence $\Delta n$ for visible light) has a low specific resistance, as described above, an LCD panel driving method, when applied as it is, cannot sufficiently hold the voltage applied to the liquid crystal layer. Then, the effective voltage applied to the liquid crystal layer lowers, and the static capacitance value of the liquid crystal capacitor fails to reach the target value.

Thus, when the voltage applied to the liquid crystal layer shifts from a predetermined value, the direction in which the antenna gain is maximized shifts from a predetermined direction. Then, a communication satellite cannot be tracked accurately, for example. In order to prevent this, the storage capacitor CS is provided electrically in parallel to the liquid crystal capacitor Clc, thereby sufficiently increasing the capacitance value C-Ccs of the storage capacitor CS. The capacitance value C-Ccs of the storage capacitor CS is preferably set appropriately so that the voltage retention of the liquid crystal capacitor Clc is 90% or more.

When a liquid crystal material having a low specific resistance is used, a voltage drop also occurs due to the interfacial polarization and/or the alignment polarization. In order to prevent the voltage drop due to these polarizations, one may consider applying a sufficiently high voltage taking into the voltage drop consideration. However, when a high voltage is applied to a liquid crystal layer having a low specific resistance, a dynamic scattering effect (DS effect) may occur. The DS effect is ascribed to the convection of ionic impurities in the liquid crystal layer, and the dielectric constant $\varepsilon_M$ of the liquid crystal layer approaches the average value (($\varepsilon_M//+2\varepsilon_M\perp$)/3). In order to control the dielectric constant $\varepsilon_M$ of the liquid crystal layer in multiple steps (multiple levels), it is not possible to always apply a sufficiently high voltage.

In order to suppress the voltage drop due to the DS effect and/or the polarization described above, the polarity inversion cycle of the voltage applied to the liquid crystal layer can be made sufficiently short. As is well known in the art, when the polarity inversion cycle of the applied voltage is shortened, the threshold voltage for the DS effect increases. Therefore, the polarity inversion frequency can be determined so that the maximum value of the voltage (absolute value) applied to the liquid crystal layer is less than the threshold voltage for the DS effect. When the polarity inversion frequency is 300 Hz or more, it is possible to ensure a desirable operation even when a voltage whose absolute value is 10 V is applied to a liquid crystal layer whose specific resistance is $1\times10^{10}$ Ω·cm and whose dielectric anisotropy $\Delta\varepsilon$ (@1 kHz) is about −0.6. When the polarity inversion frequency (typically equal to twice the frame frequency) is 300 Hz or more, it is possible to suppress the voltage drop due to polarization described above. The upper limit of the polarity inversion cycle is preferably about 5 kHz or less in view of the power consumption, etc.

As described above, since the viscosity of the liquid crystal material is dependent on the temperature, the temperature of the liquid crystal layer is preferably controlled appropriately. The physical properties and driving conditions of the liquid crystal material described above are those values at the operating temperature of the liquid crystal layer. Conversely, the temperature of the liquid crystal layer is preferably controlled so as to achieve driving under the conditions described above.

Referring to FIGS. 17(a) to 17(g), an example waveform of a signal used for driving the scanned antenna will be described. Note that for the purpose of comparison, FIG. 17(d) shows the waveform of a display signal Vs (LCD) to be applied to the source bus line of an LCD panel.

FIG. 17(a) shows the waveform of the scanning signal Vg supplied to a gate bus line G-L1, FIG. 17(b) the waveform of the scanning signal Vg supplied to a gate bus line G-L2, FIG. 17(c) the waveform of the scanning signal Vg supplied to a gate bus line G-L3, FIG. 17(e) the waveform of a data signal Vda supplied to the source bus line, FIG. 17(f) the waveform of the slot voltage Vidc supplied to the slot electrode (slot electrode) of the slot substrate, and FIG. 17(g) the waveform of the voltage applied to the liquid crystal layer of the antenna element.

As shown in FIG. 17(a) to (c), the voltages of the scanning signals Vg supplied to the gate bus lines successively transition from low level (VgL) to high level (VgH). VgL and VgH can be set appropriately depending on the characteristics of the TFT. For example, VgL=−5 V to 0 V and Vgh=+20 V. Alternatively, VgL=−20 V and Vgh=+20 V. The period from a point in time when the voltage of the scanning signal Vg on a gate bus line transitions from low level (VgL) to high level (VgH) until a point in time when the voltage on the next gate bus line transitions from VgL to VgH is regarded herein as one horizontal scanning period (1H). The period during which the voltage on each gate bus line is high level (VgH) is referred to as the selection period PS. In this selection period PS, TFTs connected to the gate bus line are turned ON, and the voltage at this point of the data signal Vda supplied to the source bus line is supplied to the corresponding patch electrode. The data signal Vda is −15 V to +15 V (the absolute value is 15 V), for example, and data signals Vda having different absolute values corresponding to 12 levels, preferably 16 levels, are used, for example.

Herein, a case in which a certain intermediate voltage is applied to all antenna elements will be illustrated. That is, the voltage of the data signal Vda is assumed to be constant for all antenna elements (assumed to be connected to m gate bus lines). This corresponds to a case in which a certain intermediate level is displayed across the entire LCD panel. Then, in an LCD panel, dot inversion driving is performed. That is, in each frame, display signal voltages are supplied so that pixels (dots) adjacent to each other have opposite polarities.

FIG. 17(d) shows the waveform of the display signal of an LCD panel employing dot inversion driving. As shown in FIG. 17(d), the polarity of Vs (LCD) is inverted every 1H. The polarity of Vs (LCD) supplied to a source bus line that is adjacent to the source bus line to which Vs (LCD) having this waveform is supplied is opposite to the polarity of Vs (LCD) shown in FIG. 17(d). The polarity of the display signal supplied to any pixel is inverted every frame. In an LCD panel, it is difficult to completely match the positive polarity and the negative polarity with each other in terms of the level of the effective voltage applied to the liquid crystal layer, and the difference in effective voltage is observed as flicker. In order to make flicker less likely to be observed, pixels (dots) to which voltages of different polarities are applied in each frame are spatially dispersed. Typically, by performing dot inversion driving, pixels (dots) of different polarities are arranged in a checkered pattern.

In contrast, with a scanned antenna, flicker itself will not be problematic. That is, it is only required that the static capacitance value of the liquid crystal capacitor is equal to a desired value, and the polarity spatial distribution in each frame is not an issue. Therefore, in view of the low power consumption, etc., it is preferred that the number of polarity inversions of the data signal Vda supplied from the source bus line is lowered, i.e., that the polarity inversion cycle is elongated. For example, the polarity inversion cycle may be set to 10H (polarity inversion every 5H) as shown in FIG. 17(e). It is understood that where the number of antenna elements connected to each source bus line (which is typically equal to the number of gate bus lines) is m, the polarity inversion cycle of the data signal Vda may be set to 2m·H (polarity inversion every m·H). The polarity inversion cycle of the data signal Vda may be set to be equal to two frames (polarity inversion every frame).

The data signals Vda supplied from all source bus lines may be set to the same polarity. Therefore, the data signal Vda of the positive polarity may be supplied from all source bus lines in one frame, and the data signal Vda of the negative polarity may be supplied from all source bus lines in the next frame, for example.

Alternatively, the polarities of the data signals Vda supplied from source bus lines adjacent to each other may be set to be the opposite polarities. For example, in one frame, the data signal Vda of the positive polarity is supplied from source bus lines of odd-numbered columns while supplying the data signal Vda of the negative polarity from source bus lines of even-numbered columns. Then, in the next frame, the data signal Vda of the negative polarity is supplied from source bus lines of odd-numbered columns, and the data signal Vda of the positive polarity is supplied from source bus lines of even-numbered columns. Such a driving method is referred to as source line inversion driving for LCD panels. When the data signals Vda supplied from adjacent source bus lines are of opposite polarities, adjacent source bus lines can be connected (shorted) together to cancel out, between adjacent columns, the electric charge stored in the liquid crystal capacitor, before the polarity of the data signal Vda to be supplied is inverted between frames. Therefore, there is an advantage that it is possible to lower the amount of electric charge to be supplied from source bus lines in each frame.

Figure 17:
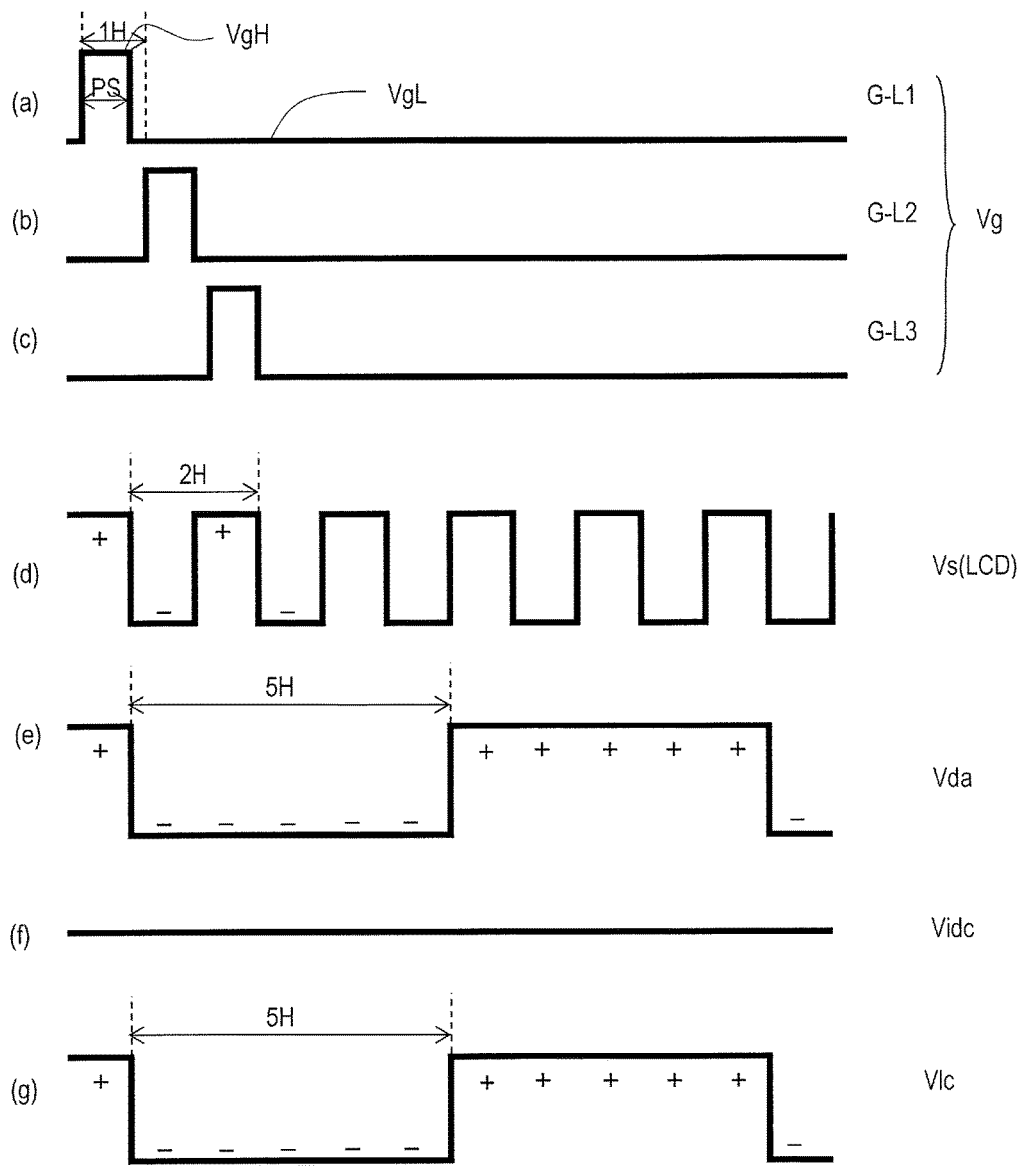
FIG. 17(a) to (c) and (e) to (g) are diagrams showing example waveforms of various signals used for driving the scanned antenna of the embodiment, and (d) is a diagram showing the waveform of a display signal of an LCD panel driven by dot inversion driving.

As shown in FIG. 17(f), the voltage Vidc of the slot electrode is a DC voltage, for example, and is typically the ground potential. The capacitance value of the capacitor of the antenna element (the liquid crystal capacitor and the storage capacitor) is greater than the capacitance value of the pixel capacitor of an LCD panel (e.g., about 30 times that of an LCD panel whose size is about 20 inches). Therefore, there is no influence of the pull-in voltage due to the parasitic capacitor of the TFT, and the voltage to be supplied to the patch electrode will be a positive-negative symmetric voltage even when the voltage Vidc of the slot electrode is the ground potential and the data signal Vda is a voltage that is positive-negative symmetric with respect to the ground potential. In an LCD panel, the voltage of the counter electrode (common voltage) is adjusted taking into consideration the pull-in voltage of the TFT so that a positive-negative symmetric voltage is applied to the pixel electrode. For the slot voltage of a scanned antenna, however, it is not needed, and it can be the ground potential. Although not shown in FIG. 17, the same voltage as the slot voltage Vidc is applied to the CS bus line.

Since the voltage applied to the liquid crystal capacitor of the antenna element is the voltage of the patch electrode for the voltage Vidc of the slot electrode (FIG. 17(f)) (i.e., the voltage of the data signal Vda shown in FIG. 17(e)), when the slot voltage Vidc is the ground potential, it matches the waveform of the data signal Vda shown in FIG. 17(e), as shown in FIG. 17(g).

The waveform of the signal used for driving the scanned antenna is not limited to examples described above. For example, Viac having an oscillation waveform may be used a the voltage of the slot electrode, as will be described with reference to FIG. 18 and FIG. 19.

For example, signals illustrated in FIGS. 18(a) to 18(e) may be used. Although the waveform of the scanning signal Vg supplied to the gate bus line is omitted in FIG. 18, the scanning signal Vg described above with reference to FIG. 17(a) to (c) is also used herein.

As shown in FIG. 18(a), a case in which the polarity of the waveform of the data signal Vda is inverted with a 10H cycle (every 5H), in a similar manner to that shown in FIG. 17(e), will be illustrated. Herein, a case in which the amplitude of the data signal Vda is the maximum value |Vda$_{max}$| will be illustrated. As described above, the polarity of the waveform of the data signal Vda may be inverted with a two-frame cycle (every frame).

Herein, the voltage Viac of the slot electrode is an oscillating voltage whose polarity is opposite to that of the data signal Vda (ON) and whose oscillation cycle is the same as that of the data signal Vda (ON), as shown in FIG. 18(c). The amplitude of the voltage Viac of the slot electrode is equal to the maximum value |Vda$_{max}$| of the amplitude of the data signal Vda. That is, the slot voltage Viac is a voltage whose polarity inversion cycle is the same as that of the data signal Vda (ON) and which oscillates between $-Vda_{max}$ and $+Vda_{max}$ with the opposite polarity (the phase shifted by 180°).

Since the voltage Vlc applied to the liquid crystal capacitor of the antenna element is the voltage of the patch electrode for the voltage Viac of the slot electrode (FIG. 18(c)) (i.e., the voltage of the data signal Vda (ON) shown in FIG. 18(a)), when the amplitude of the data signal Vda oscillates with $\pm Vda_{max}$, the voltage applied to the liquid crystal capacitor has a waveform that oscillates with an amplitude twice $Vda_{max}$ as shown in FIG. 18(d). Therefore, the maximum amplitude of the data signal Vda that is required for the maximum amplitude of the voltage Vlc applied to the liquid crystal capacitor to be $\pm Vda_{max}$ is $\pm Vda_{max}/2$.

By using such a slot voltage Viac, the maximum amplitude of the data signal Vda can be reduced to half. Therefore, there is an advantage that a general-purpose driver IC whose breakdown voltage is 20 V or less, for example, can be used as the driver circuit for outputting the data signal Vda.

Note that in order to set the voltage Vlc (OFF) applied to the liquid crystal capacitor of the antenna element to zero as shown in FIG. 18(e), the data signal Vda (OFF) can be set to the same waveform as that of the slot voltage Viac as shown in FIG. 18(b).

For example, consider a case in which the maximum amplitude of the voltage Vlc applied to the liquid crystal capacitor is set to ±15 V. When Vidc shown in FIG. 17(f) is used as the slot voltage and when Vidc=0 V, the maximum amplitude of Vda shown in FIG. 17(e) is ±15 V. In contrast, when Viac shown in FIG. 18(c) is used as the slot voltage and when the maximum amplitude of Viac is ±7.5 V, the maximum amplitude of Vda (ON) shown in FIG. 18(a) is ±7.5 V.

When the voltage Vlc applied to the liquid crystal capacitor is 0 V, Vda shown in FIG. 17(e) can be set to 0 V, and the maximum amplitude of Vda (OFF) shown in FIG. 18(b) can be set to ±7.5 V.

When Viac shown in FIG. 18(c) is used, the amplitude of the voltage Vlc applied to the liquid crystal capacitor is different from the amplitude of Vda and needs to be converted appropriately.

Signals as illustrated in FIGS. 19(a) to 19(e) may also be used. Similar to the signals shown in FIGS. 18(a) to 18(e), the signals shown in FIGS. 19(a) to 19(e) are oscillating voltages whose oscillation phase is shifted by 180° from the data signal Vda (ON), as FIG. 19(c) illustrates the voltage Viac of the slot electrode. Note however that as shown in FIG. 19(a) to (c), respectively, the data signal Vda (ON), the data signal Vda (OFF) and the slot voltage Viac are each a voltage that oscillates between 0 V and a positive voltage. The amplitude of the voltage Viac of the slot electrode is equal to the maximum value $|Vda_{max}|$ of the amplitude of the data signal Vda.

Using such signals, the driving circuit only needs to output positive voltages, thus contributing to cost reduction. Thus, even when using a voltage that oscillates between 0 V and a positive voltage, the polarity of the voltage Vlc (ON) applied to the liquid crystal capacitor is inverted as shown in FIG. 19(d). In the voltage waveform shown in FIG. 19(d), + (positive) denotes that the voltage of the patch electrode is higher than the slot voltage and − (negative) denotes that the voltage of the patch electrode is lower than the slot voltage. That is, the orientation (polarity) of the electric field applied to the liquid crystal layer is inverted as in other examples. The amplitude of the voltage Vlc (ON) applied to the liquid crystal capacitor is $Vda_{max}$.

Note that in order to set the voltage Vlc (OFF) applied to the liquid crystal capacitor of the antenna element to zero as shown in FIG. 19(e), the data signal Vda (OFF) can be set to the same waveform as that of the slot voltage Viac as shown in FIG. 19(b).

Figure 18:
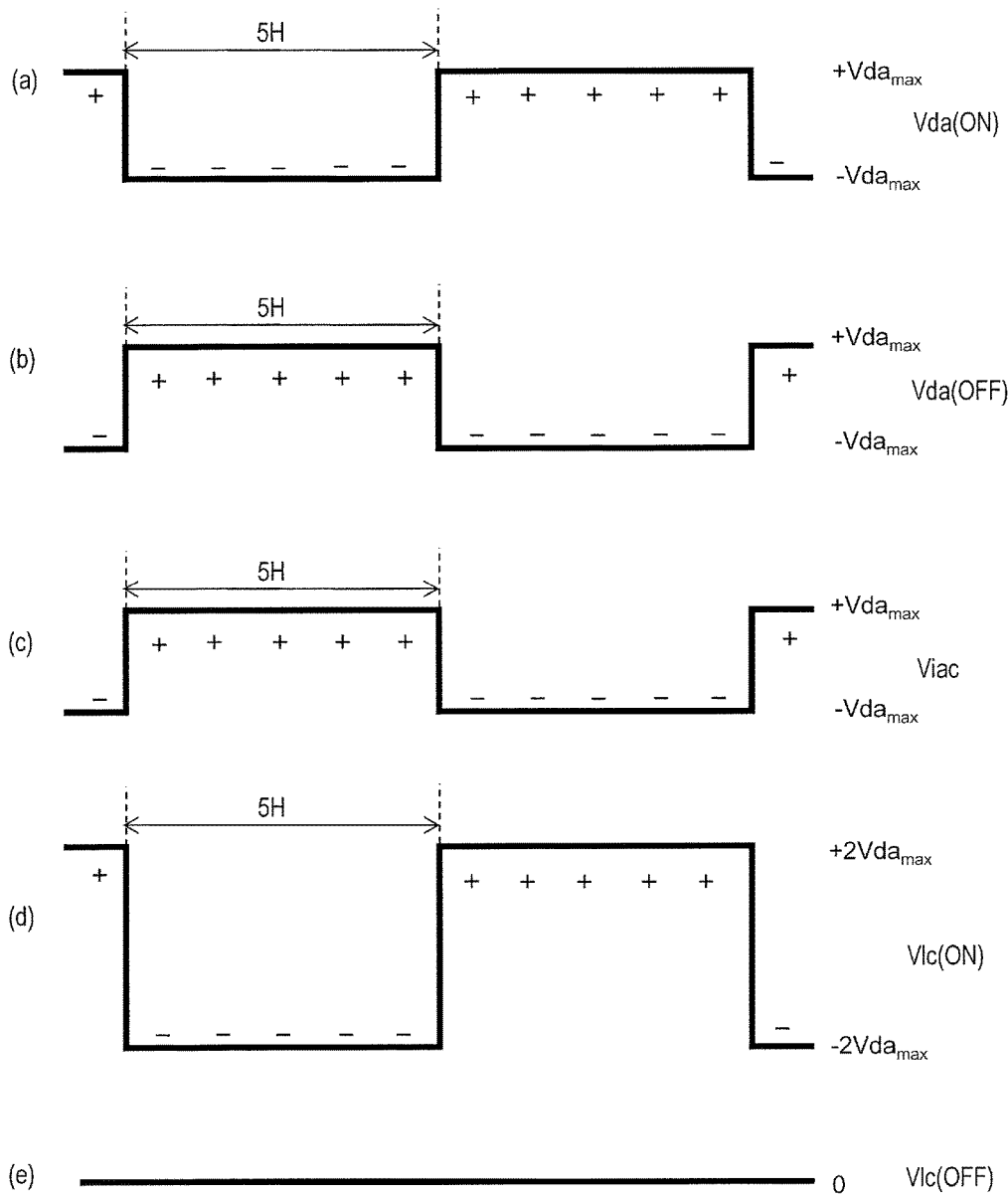
FIG. 18(a) to (e) are diagrams showing other example waveforms of various signals used for driving the scanned antenna of the embodiment.
Figure 19:
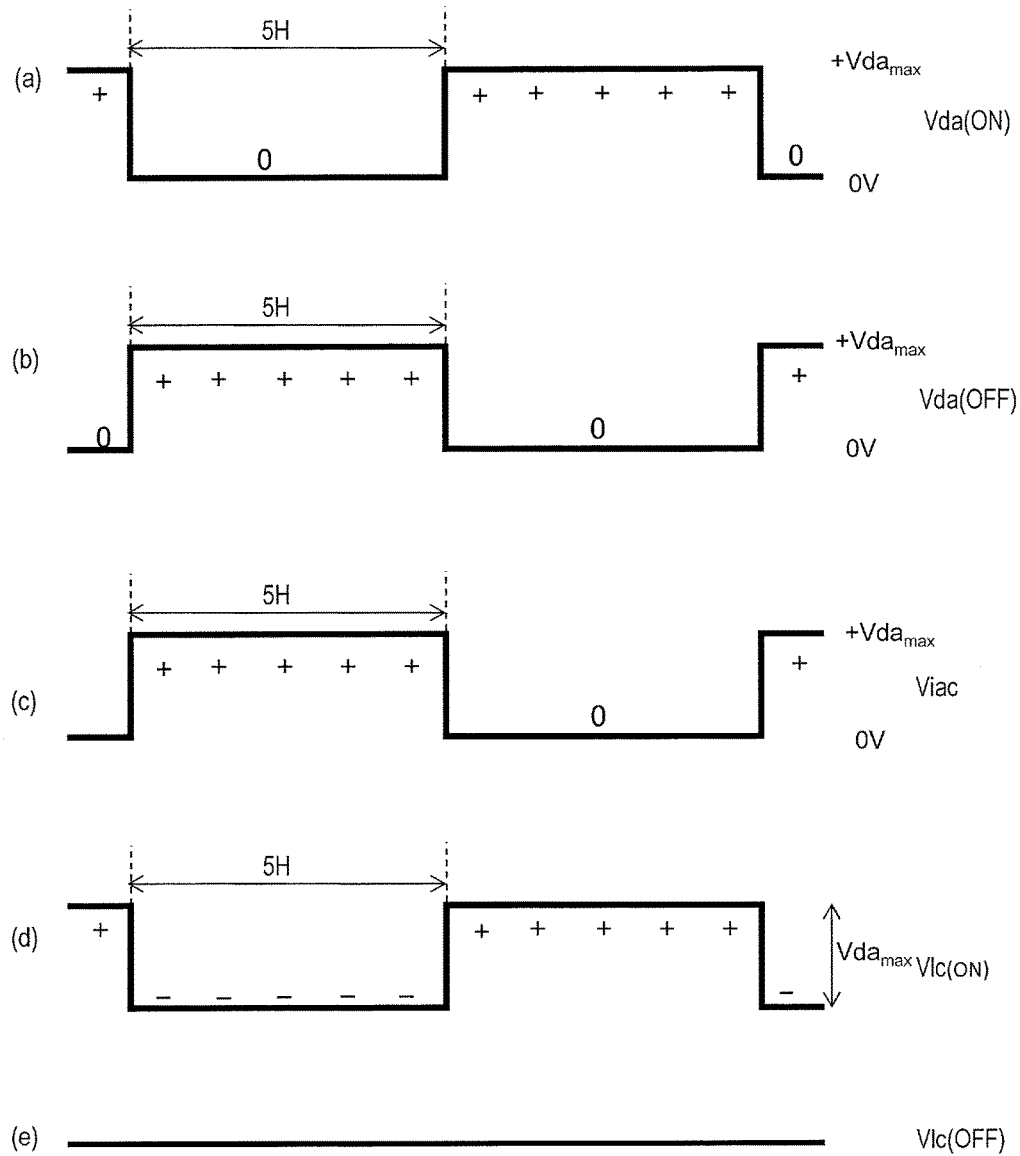
FIG. 19(a) to (e) are diagrams showing other example waveforms of various signals used for driving the scanned antenna of the embodiment.

The driving method for oscillating (inverting) the voltage Viac of the slot electrode described above with reference to FIG. 18 and FIG. 19 corresponds, in terms of LCD panel driving methods, to a driving method in which the counter voltage is inverted (which may be referred to as the "common inversion driving"). The common inversion driving is not employed for LCD panels because it is not possible to sufficiently suppress the flicker. In contrast, with a scanned antenna, since flicker is not problematic, the slot voltage can be inverted. For example, the oscillation (inversion) is done every frame (5H in FIG. 18 and FIG. 19 is 1V (vertical scanning period or frame)).

While the description above is directed to an example in which a single voltage is applied as the voltage Viac of the slot electrode, i.e., a common slot electrode is provided for all the patch electrodes, the slot electrode may be divided into sections each corresponding to one row of patch electrodes or to two or more rows of patch electrodes. A row as used herein refers to a collection of patch electrodes that are connected to a single gate bus line via TFTs. When the slot electrode is divided into a plurality of row sections as described above, the polarity of the voltage of each section of the slot electrode can be controlled independently. For example, in any frame, the polarity of the applied voltage can be inverted between patch electrodes connected to gate bus lines adjacent to each other. Thus, it is possible to employ not only the row inversion (1H inversion) in which the polarity is inverted every row of patch electrodes but also the m-row inversion (mH inversion) in which the polarity is inverted every set of two or more rows. It is understood that the row inversion and the frame inversion can be combined with each other.

In view of the simplicity of the driving operation, a driving operation is preferred in which voltages applied to the patch electrodes all have the same polarity in any frame, wherein the polarity is inverted every frame.

<Examples of Antenna Element Arrangement and Gate Bus Line and Source Bus Line Connection>

In the scanned antenna of the embodiment of the present invention, the antenna elements are arranged in a concentric pattern, for example.

For example, when they are arranged along m concentric circles, one gate bus line is provided for each circle, for example, i.e., a total of m gate bus lines. Where the outer diameter of the transmitting/receiving region R1 is 800 mm, for example, m is 200, for example. Where the innermost gate bus line is denoted as $1^{st}$, n (e.g., 30) antenna elements are connected to the $1^{st}$ gate bus line while nx (e.g., 620) antenna elements are connected to the $m^{th}$ gate bus line.

With such an arrangement, the number of antenna elements connected to each gate bus line varies. While m antenna elements are connected to nx source bus lines connected to nx antenna elements forming the outermost circle, the number of antenna elements connected to source bus lines connected to the antenna elements forming an inner circle is less than m.

Thus, the arrangement of antenna elements in a scanned antenna is different from the arrangement of pixels (dots) in an LCD panel, in that the number of antenna elements connected varies from one gate bus line and/or source bus line to another. Therefore, if the capacitance (liquid crystal capacitor+storage capacitor) is the same for all the antenna elements, the electric load connected will vary from one gate bus line and/or source bus line to another. Then, there is a problem that voltages written to antenna elements vary.

In order to prevent this, it is preferred that substantially the same electric load is connected to each gate bus line and source bus line by, for example, adjusting the capacitance value of the storage capacitor or by adjusting the number of antenna elements connected to the gate bus line and/or source bus line.

The scanned antenna of the embodiment of the present invention is accommodated in a plastic casing, for example. It is preferred that a material having a small dielectric constant $\varepsilon_M$ that does not affect the transmission/reception of microwaves is used for the casing. A through hole may be provided in a portion of the casing that corresponds to the transmitting/receiving region R1. Moreover, a light-blocking structure may be provided so that the liquid crystal material is not exposed to light. The light-blocking structure is provided so as to, for example, block light coming from the side surface of the dielectric substrate 1 of the TFT substrate 101 and/or the side surface of the dielectric substrate 51 of the slot substrate 201 and propagating through the inside of the dielectric substrates 1 and/or 51 to enter the liquid crystal layer. Some liquid crystal materials having high dielectric anisotropies $\Delta\varepsilon_M$, are easily deteriorated by light, and it is preferred to block not only ultraviolet light but also blue light which has a short wavelength among visible light. By using a light-blocking tape such as a black adhesive tape, for example, the light-blocking structure can be easily formed at a position where it is needed.

INDUSTRIAL APPLICABILITY

The embodiment of the present invention provides, for example, a scanned antenna for satellite communications and satellite broadcasting to be mounted on a vehicle (e.g., a ship, an aircraft, an automobile) and a method for manufacturing the same.

REFERENCE SIGNS LIST

1: Dielectric substrate
2: Base insulating film
3: Gate electrode
4: Gate insulating layer
5: Semiconductor layer
6D: Drain contact layer
6S: Source contact layer
7D: Drain electrode
7S: Source electrode
7p: Source connection line
11: First insulating layer
15: Patch electrode
15p: Patch connecting portion
17: Second insulating layer
18g, 18s, 18p: Opening
19g: Gate terminal upper connecting portion
19p: Transfer terminal upper connecting portion
19s: Source terminal upper connecting portion
21: Alignment mark
23: Protection conductive layer
51: Dielectric substrate
52: Third insulating layer
54: Dielectric layer (air layer)
55: Slot electrode
55L: Lower layer
55M: Main layer
55U: Upper layer
55c: Contact surface
57: Slot
58: Fourth insulating layer
60: Upper connecting portion
65: Reflective conductive plate
68: Heater resistive film
70: Power feed device
71: Conductive beads
72: Power feed pin
73: Seal portion
101, 102, 103: TFT substrate
201, 203: Slot substrate
1000: Scanned antenna
CH1, CH2, CH3, CH4, CH5, CH6: Contact hole
GD: Gate driver
GL: Gate bus line
GT: Gate terminal portion
SD: Source driver
SL: Source bus line
ST: Source terminal portion
PT: Transfer terminal portion
IT: Terminal portion
LC: Liquid crystal layer
R1: Transmitting/receiving region
R2: Non-transmitting/receiving region
Rs: Seal region
U: Antenna element, antenna element region

The invention claimed is:

1. A TFT substrate comprising a dielectric substrate and a plurality of antenna element regions arranged on the dielectric substrate, the TFT substrate comprising a transmitting/receiving region including the plurality of antenna element regions therein, and a non-transmitting/receiving region located outside of the transmitting/receiving region, each of the plurality of antenna element regions comprising:
a thin film transistor supported on the dielectric substrate, the thin film transistor including a gate electrode, a semiconductor layer, a gate insulating layer located between the gate electrode and the semiconductor layer, and a source electrode and a drain electrode electrically connected to the semiconductor layer;
a first insulating layer covering the thin film transistor and having a first opening which exposes the drain electrode of the thin film transistor; and
a patch electrode formed on the first insulating layer and in the first opening, and electrically connected to the drain electrode of the thin film transistor,
wherein the patch electrode includes a metal layer, and a thickness of the metal layer is greater than a thickness of the source electrode and the drain electrode of the thin film transistor.

2. The TFT substrate according to claim 1, further comprising a second insulating layer covering the patch electrode.

3. The TFT substrate according to claim 1, wherein the thickness of the metal layer is 1 μm or more and 30 μm or less.

4. The TFT substrate according to claim 1, further comprising, in the transmitting/receiving region, a resistive film formed on the dielectric substrate and a heater terminal connected to the resistive film.

5. The TFT substrate according to claim 2, further comprising a transfer terminal portion arranged in the non-transmitting/receiving region, the transfer terminal portion comprising:

a patch connecting portion formed of the same conductive film as the patch electrode;
the second insulating layer extending over the patch connecting portion and having a second opening which exposes a portion of the patch connecting portion; and
an upper transparent electrode formed on the second insulating layer and in the second opening, and electrically connected to the patch connecting portion.

6. The TFT substrate according to claim 5, further comprising a gate terminal portion, the gate terminal portion comprising:
a gate bus line formed of the same conductive film as the gate electrode;
the gate insulating layer, the first insulating layer and the second insulating layer which extend over the gate bus line; and
a gate terminal upper connecting portion formed of the same transparent conductive film as the upper transparent electrode, wherein:
a gate terminal contact hole exposing a portion of the gate bus line is formed in the gate insulating layer, the first insulating layer and the second insulating layer; and
the gate terminal upper connecting portion is arranged on the second insulating layer and in the gate terminal contact hole, and is in contact with the gate bus line in the gate terminal contact hole.

7. The TFT substrate according to claim 2, further comprising a transfer terminal portion arranged in the non-transmitting/receiving region, the transfer terminal portion comprising:
a source connection line formed of the same conductive film as the source electrode;
the first insulating layer extending over the source connection line, and having a third opening which exposes a portion of the source connection line, and a fourth opening which exposes another portion of the source connection line;
a patch connecting portion formed on the first insulating layer and in the third opening; and
an upper transparent electrode formed on the first insulating layer and in the fourth opening, wherein:
the patch connecting portion is electrically connected to the upper transparent electrode via the source connection line;
the patch connecting portion is formed of the same conductive film as the patch electrode; and
the second insulating layer extends over the transfer terminal portion, covers the patch connecting portion, and has an opening which exposes at least a portion of the upper transparent electrode.

8. The TFT substrate according to claim 2, further comprising a transfer terminal portion arranged in the non-transmitting/receiving region, the transfer terminal portion comprising:
a patch connecting portion on the first insulating layer, the patch connecting portion being formed of the same conductive film as the patch electrode; and
a protection conductive layer covering the patch connecting portion,
wherein the second insulating layer extends over the protection conductive layer, and has an opening which exposes a portion of the protection conductive layer.

9. The TFT substrate according to claim 7, further comprising a gate terminal portion, the gate terminal portion comprising:
a gate bus line formed of the same conductive film as the gate electrode;
the gate insulating layer and the first insulating layer which extend over the gate bus line; and
a gate terminal upper connecting portion formed of a transparent conductive film, wherein:
a gate terminal contact hole exposing the gate terminal upper connecting portion is formed in the gate insulating layer and the first insulating layer;
the gate terminal upper connecting portion is arranged on the first insulating layer and in the gate terminal contact hole, and is in contact with the gate bus line in the gate terminal contact hole; and
the second insulating layer extends over the gate terminal upper connecting portion, and has an opening which exposes a portion of the gate terminal upper connecting portion.

10. A scanned antenna comprising:
the TFT substrate according to claim 1;
a slot substrate arranged so as to oppose the TFT substrate;
a liquid crystal layer provided between the TFT substrate and the slot substrate; and
a reflective conductive plate arranged so as to oppose a surface of the slot substrate that is opposite from the liquid crystal layer with a dielectric layer interposed therebetween;
the slot substrate includes another dielectric substrate and a slot electrode formed on a surface of the other dielectric substrate that is closer to the liquid crystal layer; and
the slot electrode includes a plurality of slots arranged so as to correspond to the patch electrode in the plurality of antenna element regions of the TFT substrate.

11. A scanned antenna comprising:
the TFT substrate according to claim 5;
a slot substrate arranged so as to oppose the TFT substrate;
a liquid crystal layer provided between the TFT substrate and the slot substrate; and
a reflective conductive plate arranged so as to oppose a surface of the slot substrate that is opposite from the liquid crystal layer with a dielectric layer interposed therebetween, wherein:
the slot substrate includes another dielectric substrate and a slot electrode formed on a surface of the other dielectric substrate that is closer to the liquid crystal layer;
the slot electrode includes a plurality of slots arranged so as to correspond to the patch electrode in the plurality of antenna element regions of the TFT substrate; and
the slot electrode is connected to the transfer terminal portion of the TFT substrate.

12. A method for manufacturing a TFT substrate comprising a transmitting/receiving region including a plurality of antenna element regions therein, and a non-transmitting/receiving region other than the transmitting/receiving region, the plurality of antenna element regions each including a thin film transistor and a patch electrode, the method comprising the steps of:
(a) forming a thin film transistor on a dielectric substrate;
(b) forming a first insulating layer covering the thin film transistor, and forming in the first insulating layer a first opening which exposes a portion of a drain electrode of the thin film transistor;
(c) forming a patch electrode conductive film on the first insulating layer and in the first opening, and patterning the patch electrode conductive film so as to form a patch electrode in contact with the drain electrode in the first opening; and (d) forming a second insulating layer covering the patch electrode, wherein the patch electrode includes a metal layer, and a thickness of the metal layer is greater than a thickness of a source electrode and the drain electrode of the thin film transistor.

13. The method for manufacturing a TFT substrate according to claim 12, wherein the step (a) comprises the steps of:

(a1) forming a gate conductive film on a dielectric substrate, and patterning the gate conductive film so as to form a plurality of gate bus lines and a gate electrode of the thin film transistor;

(a2) forming a gate insulating layer covering the plurality of gate bus lines and the gate electrodes;

(a3) forming a semiconductor layer of the thin film transistor on the gate insulating layer; and (a4) forming a source conductive film on the semiconductor layer and on the gate insulating layer, and patterning the source conductive film so as to form a plurality of source bus lines, and a source electrode and a drain electrode connected to the semiconductor layer, thus obtaining the thin film transistor.

14. A method for manufacturing a TFT substrate according to claim 13, wherein:

the TFT substrate further includes a gate terminal portion and a transfer terminal portion in the non-transmitting/receiving region;

the step (c) includes a step of patterning the patch electrode conductive film so as to form a patch connecting portion in the non-transmitting/receiving region; and after the step (d), the method comprises the steps of:

etching the gate insulating layer, the first insulating layer and the second insulating layer in a single step, thereby forming a second opening which exposes the patch connecting portion in the second insulating layer, and forming a gate terminal contact hole which exposes a portion of the gate bus line in the gate insulating layer, the first insulating layer and the second insulating layer; and forming a transparent conductive film on the second insulating layer, in the second opening and in the gate terminal contact hole, and patterning the transparent conductive film so as to form an upper transparent electrode in contact with the patch connecting portion in the second opening, thus obtaining the transfer terminal portion and to form a gate terminal upper connecting portion in contact with the gate bus line in the gate terminal contact hole, thus obtaining the gate terminal portion.

15. A method for manufacturing a TFT substrate according to claim 13, wherein:

the TFT substrate further comprises a gate terminal portion and a transfer terminal portion in the non-transmitting/receiving region;

the step (a4) includes a step of patterning the source conductive film so as to form a source connection line in the non-transmitting/receiving region;

the step (b) of forming the first opening in the first insulating layer and forming a third opening which exposes a portion of the source connection line, a fourth opening which exposes a portion of the source connection line, and a gate terminal contact hole which exposes a portion of the gate bus line;

the method further comprises, between the step (b) and the step (c), a step of forming a transparent conductive film and patterning the transparent conductive film so as to form an upper transparent electrode in contact with the source connection line in the third opening and form a gate terminal upper connecting portion in contact with the gate bus line in the gate terminal contact hole, thus obtaining the gate terminal portion;

the step (c) further includes a step of patterning the patch electrode conductive film so as to form a patch connecting portion in contact with the source connection line in the fourth opening, thus obtaining the transfer terminal portion, wherein in the transfer terminal portion, the patch connecting portion and the upper transparent electrode are electrically connected to each other via the source connection line; and the method further comprises, after the step (d), a step of forming, in the second insulating layer, an opening which exposes a portion of the upper transparent electrode, and an opening which exposes a portion of the gate terminal upper connecting portion.

16. A method for manufacturing a TFT substrate according to claim 13, wherein:

the TFT substrate further comprises a gate terminal portion and a transfer terminal portion in the non-transmitting/receiving region;

the step (b) includes a step of forming the first opening in the first insulating layer and forming gate terminal contact hole exposing a portion of the gate bus line;

the method further comprises, between the step (b) and the step (c), a step of forming a transparent conductive film and patterning the transparent conductive film so as to form a gate terminal upper connecting portion in contact with the gate bus line in the gate terminal contact hole, thus obtaining the gate terminal portion;

the step (c) includes a step of patterning the patch electrode conductive film so as to form a patch connecting portion in the non-transmitting/receiving region;

the method further comprises, between the step (c) and the step (d), a step of forming a protection conductive layer covering the patch connecting portion; and after the step (d), the method comprises a step of forming, in the second insulating layer, an opening which exposes a portion of the protection conductive layer, and an opening which exposes a portion of the gate terminal upper connecting portion.

* * * * *